(12) United States Patent  
Watanabe et al.

(10) Patent No.: US 7,360,874 B2
(45) Date of Patent: *Apr. 22, 2008

(54) INK-JET PRINTER, INK-JET HEAD AND METHOD OF MANUFACTURING THE INK-JET HEAD

(75) Inventors: Hidetoshi Watanabe, Tokoname (JP); Atsushi Hirota, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 187 days.

This patent is subject to a terminal disclaimer.

(21) Appl. No.: 10/874,265

(22) Filed: Jun. 24, 2004

(65) Prior Publication Data

US 2005/0041074 A1 Feb. 24, 2005

(30) Foreign Application Priority Data

Jun. 30, 2003 (JP) ............................. 2003-188194

(51) Int. Cl.
*B41J 2/045* (2006.01)
(52) U.S. Cl. ....................................... 347/71
(58) Field of Classification Search ................ 347/50, 347/68–72; 29/25.35
See application file for complete search history.

(56) References Cited

U.S. PATENT DOCUMENTS

| 5,512,793 | A | 4/1996 | Takeuchi et al. |
| 6,024,439 | A | 2/2000 | Sueoka et al. |
| 6,174,051 | B1* | 1/2001 | Sakaida ........................ 347/72 |
| 6,273,558 | B1* | 8/2001 | Kitahara ...................... 347/72 |
| 6,364,468 | B1* | 4/2002 | Watanabe et al. ............. 347/68 |
| 6,419,348 | B1* | 7/2002 | Kojima et al. ................ 347/72 |
| 6,631,981 | B2 | 10/2003 | Isono et al. |
| 6,891,314 | B2 | 5/2005 | Sato et al. |
| 6,979,074 | B2* | 12/2005 | Watanabe et al. ............. 347/50 |
| 2002/0113847 | A1 | 8/2002 | Takagi et al. |
| 2003/0001931 | A1 | 1/2003 | Isono |

FOREIGN PATENT DOCUMENTS

| CN | 1392052 A | 1/2003 |
| EP | 1 403 051 A1 | 3/2004 |
| JP | A 1-178451 | 7/1989 |
| JP | A 01-238148 | 9/1989 |
| JP | A 07-214779 | 8/1995 |
| JP | A 09-141874 | 6/1997 |
| JP | A 2001-113700 | 4/2001 |
| JP | A 2002-019102 | 1/2002 |
| JP | A 2003-069103 | 3/2003 |
| JP | A 2003-0165215 | 6/2003 |

* cited by examiner

*Primary Examiner*—An H. Do
(74) *Attorney, Agent, or Firm*—Oliff & Berridge, PLC

(57) ABSTRACT

A piezoelectric sheet of an ink-jet head includes dummy individual electrodes in addition to individual electrodes which corresponds to respective nozzles. The dummy individual electrodes are in an outer periphery of the individual electrodes. FPC board applies drive voltage to the individual electrodes in a drive area, and deforms the area in the piezoelectric sheet in the direction of an ink pressure chamber, while the drive voltage is not applied to the individual electrodes of the non-drive area. When the dummy individual electrodes are formed in the non-drive area, a boundary area of the drive area and the non-drive area is uniformly fired when the piezoelectric sheet is manufactured. In the drive area, since surrounding structures of the respective individual electrodes become equal to one another, ink discharge characteristic is substantially uniform in the boundary area of the drive area and the non-drive area.

19 Claims, 18 Drawing Sheets

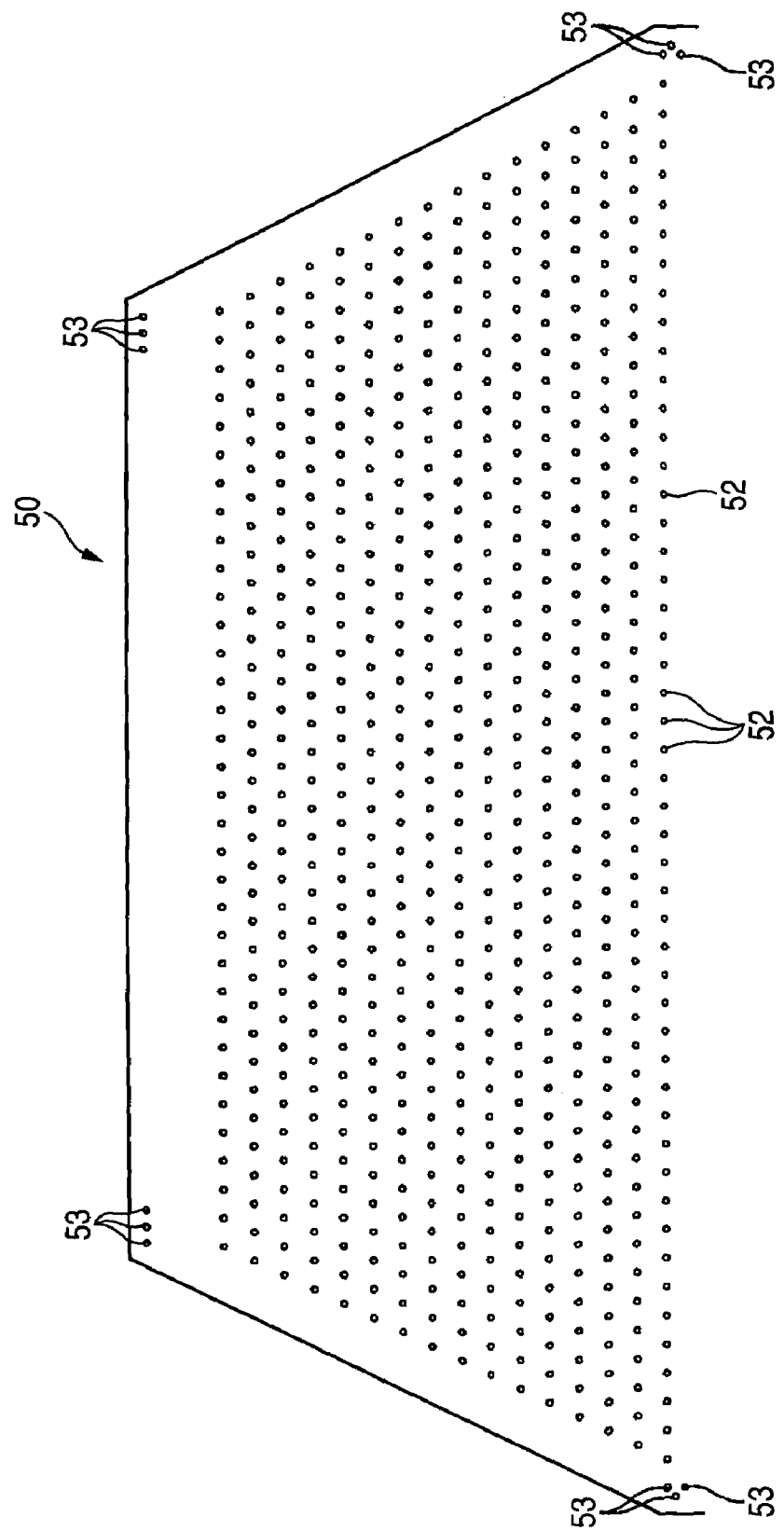

INK-JET PRINTER, INK-JET HEAD AND METHOD OF MANUFACTURING THE INK-JET HEAD

BACKGROUND OF THE INVENTION

1. Field of the Invention

The present invention relates to an ink-jet head, an ink-jet printer using the same, and a method of manufacturing the ink-jet head.

2. Description of the Related Art

Conventionally, there is known an ink-jet head in which a piezoelectric element is driven, ink filled in a pressure chamber adjacent to the piezoelectric element is pressed, and the ink is jetted to a recording medium such as a paper from a nozzle communicating with the pressure chamber, so that an image is formed on the recording medium. In this kind of ink-jet head, in order to obtain an excellent picture quality, it is necessary to uniformly discharge the ink from each nozzle, and in order to raise the discharge performance of ink, various techniques have been conventionally developed.

For example, in a drop-on-demand type ink-jet head as disclosed in JP-A-1-178451, in order to prevent jets of ink droplets from becoming unstable due to a decrease in damping effect of an ink reservoir and to prevent mutual interference between nozzles, dummy nozzles are provided in the ink-jet head in addition to original nozzles, and a pressure wave generated in an ink pressure chamber at the time of jetting and transmitted to the common ink reservoir is absorbed by using the dummy nozzles.

Besides, in recent years, there is known an ink-jet head in which plural lines of pressure chambers are formed in a cavity plate, and a piezoelectric sheet in which a drive electrode (so-called individual electrode) is formed for each of the pressure chambers of the cavity plate is joined to the cavity plate.

In this type of ink-jet head, voltage is applied to the respective drive electrodes of the piezoelectric sheet, and the ink in the pressure chambers corresponding thereto is jetted from nozzles. Thus, when the respective areas of the piezoelectric sheet driven by voltage application to the respective drive electrodes do not have uniform characteristics, it becomes difficult to uniformly jet ink droplets from the respective nozzles and to obtain an excellent picture quality.

In recent years, in order to raise the resolution of an image, it is required to narrow the arrangement intervals of respective pressure chambers and drive electrodes. However, the characteristic of each area of the piezoelectric sheet is greatly influenced by its surrounding structure. Accordingly, when the arrangement intervals of the respective pressure chambers and drive electrodes are narrowed, it becomes difficult to uniform the characteristics of the respective areas because of the influence.

SUMMARY OF THE INVENTION

Especially at a boundary between a drive area and a non-drive area of the piezoelectric sheet where the arrangement of the drive electrodes is interrupted, since there is no continuity in the surrounding structure, a large difference in ink discharge characteristic occurs between a nozzle corresponding to a drive electrode positioned at the end of the drive area and a nozzle corresponding to a drive electrode positioned at the center of the drive area. Incidentally, the difference in the characteristic as stated above is apt to occur in the case where the piezoelectric sheet is formed by applying a conductive paste for making the drive electrodes to the surface of a non-fired piezoelectric ceramic material, and firing it.

The present invention has been made in view of such problems. It is an object of the invention to provide an ink-jet head in which characteristics of respective areas of a piezoelectric sheet are made uniform and ink can be uniformly discharged from respective nozzles, an ink-jet printer using the same, and a method of manufacturing the ink-jet head.

In order to achieve the object, according to one aspect of the invention, ink-jet head includes a piezoelectric sheet having individual electrodes and an internal electrode, and a board for driving the piezoelectric sheet, uses the board to drive the piezoelectric sheet, and discharges ink from nozzles.

The piezoelectric sheet includes an electrode formation area including a drive area and a non-drive area around the drive area on a surface, and includes the plural individual electrodes in a whole area of the electrode formation area. Specifically, the individual electrodes are preferably disposed at equal intervals in the whole area of the electrode formation area. Besides, the internal electrode opposite to the individual electrodes of the electrode formation area is formed in the inside of the piezoelectric sheet.

The board is electrically connected to the individual electrodes in the drive area of the piezoelectric sheet, and is put into an electrically non-connected state to the individual electrodes in the non-drive area of the piezoelectric sheet, the piezoelectric sheet is electrically connected to a drive circuit, and drive voltage is applied to the respective individual electrodes of the drive area to drive the piezoelectric sheet.

In this ink-jet head, since the individual electrodes are formed also in the non-drive area, the surrounding structures of the respective individual electrodes are made substantially identical all over the drive area. Therefore, according to the ink-jet head of the first aspect, it is possible to restrain discontinuity of the surround structures from occurring at a boundary area between the drive area and the non-drive area, and to restrain uneven deformation from occurring in the piezoelectric sheet. Thus, it is possible to restrain the occurrence of a difference between the ink discharge characteristic of the nozzle corresponding to the individual electrode positioned at the end of the drive area and the ink discharge characteristic of the nozzle corresponding to the individual electrode positioned at the center part of the drive area.

The ink discharge characteristics of the respective nozzles of the ink-jet head can be made uniform, and the ink can be uniformly discharged from the respective nozzles. Thus, the picture quality of the ink-jet printer is improved.

Incidentally, the piezoelectric sheet is normally formed by firing a piezoelectric material (piezoelectric ceramic material), and at the time of firing thereof, a contraction rate of the piezoelectric material is largely changed by the surrounding structure. When variations occur in the contraction rate, variations in characteristics occurs due to that at respective parts of the piezoelectric sheet.

According to another aspect of the invention, the piezoelectric sheet is preferably formed such that plural individual electrodes are formed at equal intervals in a drive area and around the drive area on the surface of a sheet-like piezoelectric material including an internal electrode, and the piezoelectric material having the individual electrodes are fired.

When the piezoelectric sheet is formed in this way, it is possible to restrain the difference in the contraction rate from occurring at the boundary of the drive area and the non-drive area at the time of firing, and to restrain the variations in the characteristics of the piezoelectric sheet from occurring in the boundary area. Accordingly, when the ink-jet head of the second aspect is used, the picture quality of the ink-jet printer is improved.

Incidentally, according another aspect of the invention, the ink-jet head may include the piezoelectric sheet in which the plural individual electrodes are disposed in one line, it is more desirably applied to the ink-jet head including the piezoelectric sheet in which the plural individual electrodes are disposed in a matrix form (that is, two-dimensionally).

According to another aspect of the invention, the ink-jet head is such that the plural individual electrodes are disposed in a matrix form in the electrode formation area of the piezoelectric sheet.

In the case where the individual electrodes are disposed in one line, although discontinuity in the surrounding structure occurs at both ends in the arrangement direction, in the case where the individual electrodes are disposed in the matrix form, the area where the discontinuity in the surround structure occurs becomes large, and variations in the ink discharge characteristic are apt to occur. According to another aspect of the invention, the individual electrodes may be disposed in the matrix form, the foregoing effect is further exerted.

Incidentally, as the print density becomes high, the effect of the invention is more exerted. This is because as the print density becomes high, the degree of influence of the difference in the surrounding structure on the variations in the ink discharge characteristic becomes large. Accordingly, it is a very effective technique when the print density is made high.

Specifically, according to another aspect of the invention, the ink-jet head may include a connection part (also called a common electrode) electrically connected to the internal electrode via through holes on the surface of the piezoelectric sheet. Then, the connection part of the piezoelectric sheet is preferably electrically connected to the internal electrode via at least two or more through holes.

According to another aspect of the invention, two or more connection systems are prepared as connection systems of the connection part and the internal electrode, even if electric connection via one through hole is disconnected, electrical connection between the connection part and the internal electrode can be kept by another through hole. That is, according to the ink-jet head of the fifth aspect, the durability and reliability of the product can be improved.

According to another aspect of the invention, the connection part is preferably provided at a position away from the electrode formation area on the surface of the piezoelectric sheet. Since the internal electrode functions as a reversed pole of the individual electrode, when the through hole and the connection part electrically connected to the internal electrode exist near the drive area, there is a possibility that uneven deformation occurs in the piezoelectric sheet by the influence of the through hole and the connection part.

According to another aspect of the invention, the connection part is provided at the position away from the electrode formation area, since the non-drive area intervenes between the drive area and the connection part, the uneven deformation of the piezoelectric sheet due to the influence of the connection part can be suppressed to the minimum. Therefore, the ink discharge characteristics of the respective nozzles can be made uniform.

Besides, in the ink-jet head in which the board is joined to the respective individual electrodes of the drive area and the connection part, is electrically connected to them, and is fixed to the piezoelectric sheet.

According to another aspect of the invention, the connection part is provided on the surface of the piezoelectric sheet and at an end part thereof on a side where the board is provided to extend.

In the case where the board is provided to extend relative to the piezoelectric sheet, there is a high possibility that a force to peel off the board is exerted on the piezoelectric sheet from the extending side of the board, and when the force in the peeling direction is exerted on the piezoelectric sheet, joint portions between the board and the individual electrodes, and joint portions connecting the board and the connection parts are damaged, and the electrical characteristics between the board and the individual electrodes or the internal electrode are changed, or the electrical connection is disconnected.

According to another aspect of the invention, the connection part is provided on the surface of the piezoelectric sheet and at the end part thereof on the board extending direction side, and the joint strength of the piezoelectric sheet and the board is raised. Thus, even if the force to peel off the board is exerted on the piezoelectric sheet, it is possible to restrain the joint portion from being damaged by that. Therefore, according to the ink-jet head of the seventh aspect, the durability and reliability of the product is improved.

Besides, in the case where the shape of the piezoelectric sheet is square, as in an eighth aspect of the invention, the connection part is preferably provided at a corner part on the surface of the piezoelectric sheet. Then, the connection part and the respective individual electrodes of the drive area are joined to the board, and the board is fixed to the piezoelectric sheet. According to the ink-jet head constructed as stated above, since the corner part of the piezoelectric sheet is joined to the board, the connection strength of the piezoelectric sheet and the board can be raised. Besides, the connection part is provided at the corner part, so that uneven deformation of the piezoelectric sheet due to the connection part can be suppressed to the minimum. Therefore, it is possible to provide the ink-jet head excellent in the durability and excellent in the discharge performance of ink.

Besides, according to another aspect of the invention, convex contact parts joined to electrodes provided on the board are preferably provided at the respective individual electrodes of the drive area and the connection part of the piezoelectric sheet.

As in the ink-jet head constructed stated above, when the convex contact parts are provided at the connection part, when the piezoelectric sheet and the board are made to face each other and are joined, a minute gap is formed between the piezoelectric sheet and the board. Accordingly, even in the case where minute dust or the like adheres to the piezoelectric sheet, it is possible to prevent the piezoelectric sheet and the board from being damaged by the dust at the time of joining. Therefore, the reliability of the product can be improved, and the yield of the product can be improved.

Incidentally, according to another aspect of the invention, two or more convex contact parts are preferably formed at the connection part of the piezoelectric sheet. When the two or more contact parts are provided, even if the electrical connection between the electrode of the board and the internal electrode through the one contact part is disconnected, the electrical connection between the electrode of the board and the internal electrode can be kept by the other contact part. Therefore, the durability of the ink jet head can be raised.

Besides, it is preferable that the contact parts of the connection part and the contact parts of the respective individual electrodes of the drive area are provided at a same height. According to another aspect of the invention, the board can be uniformly connected to the contact parts of the connection part and the contact parts of the individual electrodes. It is possible to prevent a local load from being applied to the board and the piezoelectric sheet at the time of assembly, and it is possible to prevent the occurrence of the contact part which causes poor contact. Besides, since the heights of the respective contact parts are made the same, the electrical characteristics between the respective contact parts and the electrodes of the board can be made uniform, and ink can be uniformly discharged from the respective nozzles.

Besides, in the case where the contact parts of the connection part of the piezoelectric sheet, and the contact parts of the respective individual electrodes of the drive area are joined by soldering to the electrodes provided on the board, It is preferable that surface areas of the contact parts are made substantially equal to one another.

In the case where the contact parts and the electrodes of the board are connected by soldering, when the surface areas of the respective contact parts are different from one another, variations occurs in the amount of solder adhering to the contact parts. In such a case, there occurs the contact part where the amount of solder is so large that all the solder does not melt and the joint becomes incomplete, or the contact part where the amount of solder is so small that the solder evaporates and the joint becomes incomplete.

According to another aspect of the invention, when the surface areas are made substantially equal to one another, the amount of solder can be made uniform at the respective contact parts, and it is possible to prevent the occurrence of the contact part where the joint is incomplete. Therefore, the ink-jet head having high reliability can be provided. Incidentally, in the case where the difference in the surface areas of the respective contact parts is such an area difference that the amount of solder becomes uniform to such an extent that there does not occur the contact part where the joint becomes incomplete, the area difference is permitted, and the surface areas are regarded to be substantially equal to one another.

In the foregoing ink-jet head, a cavity plate including pressure chambers opened to the side of the piezoelectric sheet at positions corresponding to the respective individual electrodes of the drive area is joined to a back surface of the piezoelectric sheet. It is preferable that the contact parts of the respective individual electrodes of the drive area and the contact parts of the connection part of the piezoelectric sheet are provided relative to the cavity plate.

According to another aspect of the invention, the contact parts of the respective individual electrodes of the drive area, and the contact parts of the connection part of the piezoelectric sheet are disposed at part of the surface of the piezoelectric sheet opposite to a joint surface of the cavity plate joined to the back surface of the piezoelectric sheet.

An area where the pressure chamber is not formed on the surface of the cavity plate (that is, a peripheral area of the pressure chamber) constitutes the joint surface of the piezoelectric sheet and the cavity plate, and when the contact parts of the respective individual electrodes of the drive area and the contact parts of the connection part of the piezoelectric sheet are disposed on the surface of the piezoelectric sheet opposite to the pressure chambers (that is, above the pressure chambers), at the time when the board is put on the piezoelectric sheet and the board is attached, there arises a problem that a press force is applied to the piezoelectric sheet via the contact parts, and an area of the piezoelectric sheet, which is not supported by the cavity plate, is distorted and damaged.

According to another aspect of the invention, when the contact parts of the respective individual electrodes of the drive area and the contact parts of the connection part of the piezoelectric sheet are formed on the surface of the piezoelectric sheet above the joint surface of the cavity plate, at the time when the board is put on the piezoelectric sheet and the board is attached, it is possible to prevent the piezoelectric sheet from being damaged. Therefore, the yield of the product is improved.

Besides, in the cavity plate, it is preferable to provide the pressure chambers at positions corresponding to the respective individual electrodes of the drive area and the non-drive area. The cavity plate including the pressure chambers at the positions corresponding to the respective individual electrodes of the drive area and the non-drive area is joined to the back surface of the piezoelectric sheet.

With respect to the dummy individual electrodes of the non-drive area which do not function as original individual electrodes, it is not necessary to originally provide pressure chambers corresponding to those in the cavity plate. However, in the case where the pressure chambers are not provided, since the joint area of the cavity plate and the piezoelectric sheet at the non-drive area side becomes wide, uneven deformation of the piezoelectric sheet occurs at the boundary between the drive area and the non-drive area.

According to another aspect of the invention, when the dummy pressure chambers are provided to correspond to the individual electrodes of the non-drive area as well, the connection mode of the cavity plate and the piezoelectric sheet in the non-drive area becomes substantially equal to that in the drive area. Thus, at the boundary area between the drive area and the non-drive area, it is possible to restrain the uneven deformation from occurring in the piezoelectric sheet.

In the above, although the structure of the ink-jet head has been described, when an ink-jet printer is constructed as in a fifteenth aspect by using the ink-jet head of the first to fourteenth aspects, it is possible to manufacture the ink-jet printer having excellent picture quality and superior durability. Besides, since the yield of the ink-jet head is improved, the ink-jet printer can be provided inexpensively.

According to another aspect of the invention, in a method of manufacturing an ink-jet head according to the sixteenth aspect, plural individual electrodes are formed at equal intervals in a drive area and around the drive area on a surface of a sheet-like piezoelectric material including an internal electrode, and then, the piezoelectric material in which the individual electrodes are formed is fired, so that a piezoelectric sheet is formed which includes the plural individual electrodes disposed at equal intervals in the drive area and around the drive area and includes therein the internal electrode opposite to the respective individual electrodes. Then, the respective individual electrodes in the drive area of the piezoelectric sheet and respective individual electrodes for drive voltage application formed on a board for driving the piezoelectric sheet are electrically connected, and the ink-jet head is manufactured.

In the case where the piezoelectric sheet is manufactured by firing, variations in the contraction rate of the piezoelectric material occur between an area where the individual electrodes exist and an area where the individual electrodes do not exist, and variations in characteristics occur at respective parts of the piezoelectric sheet. However, when the individual electrodes are formed also in the non-drive area, and then, the piezoelectric material is fired, the condition at the time of firing becomes substantially the same between the drive area and the non-drive area. Accordingly, in the piezoelectric sheet after firing, variations in characteristics does not easily occur in the boundary area between the drive area and the non-drive area, and uniform ink discharge characteristics can be obtained in the drive area. Thus, the ink-jet head having high performance can be manufactured.

BRIEF DESCRIPTION OF THE DRAWINGS

These and other objects and advantages of this invention will become more fully apparent from the following detailed description taken with the accompanying drawings in which:

FIG. 20 is a plan view of the FPC board 50 showing the arrangement of pads 52 and 53;

DESCRIPTION OF THE PREFERRED EMBODIMENTS

Figure 1:
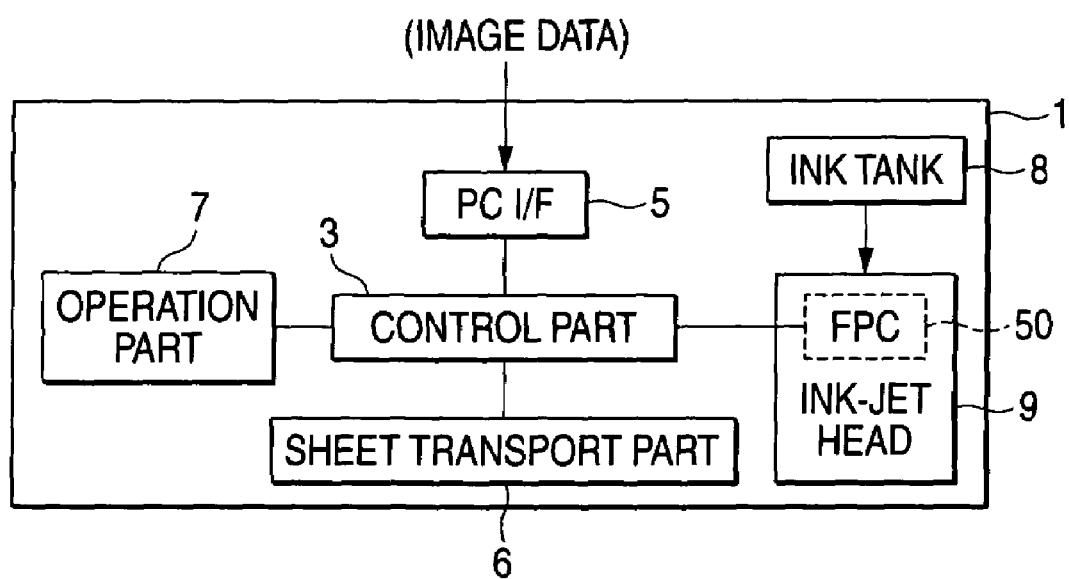
FIG. 1 is a block diagram showing a rough structure of an ink-jet printer 1 to which the invention is applied.

Hereinafter, an embodiment of the invention will be described with reference to the drawings. Incidentally, FIG. 1 is a block diagram showing a structure of an ink-jet printer 1 including an ink-jet head 9 to which this invention is applied.

The ink-jet printer 1 of this embodiment includes a control part 3 composed of a microcomputer and the like, a PC interface 5 typified by a USB interface, a sheet transport part 6 composed of a transport roller and the like, an operation part 7 equipped with various keys necessary for a user to operate the ink-jet printer 1, an ink tank 8 filled with ink, the ink-jet head 9 which is connected to the ink tank 8, forms ink droplets of the ink provided from the ink tank 8, and jets them from nozzles 111, and the like.

A personal computer (PC) or the like is connected to the ink-jet printer 1 through the PC interface 5. When receiving picture data from the outside (PC) through the PC interface 5, the control part 3 for exercising control over the ink-jet printer 1 controls the sheet transport part 6, so that a sheet is extracted from a not-shown paper feed tray, and the sheet is transported toward the ink-jet head 9. On the other hand, the control part 3 causes the ink-jet head 9 to scan in a main scanning direction, and controls the ink-jet head 9 on the basis of the image data acquired from the outside (PC), so that ink droplets are jetted from the nozzles 111 of the ink-jet head 9, and an image based on the image data acquired from the outside (PC) is formed on the sheet by the ink droplets. At this time, the sheet is transported by the sheet transport part 6 in a sub-scanning direction in synchronization with the operation of the ink-jet head 9. Besides, after the image is formed, the control part 3 ejects the sheet on which the image is formed to a not-shown paper output tray, and ends the print processing.

Figure 2:
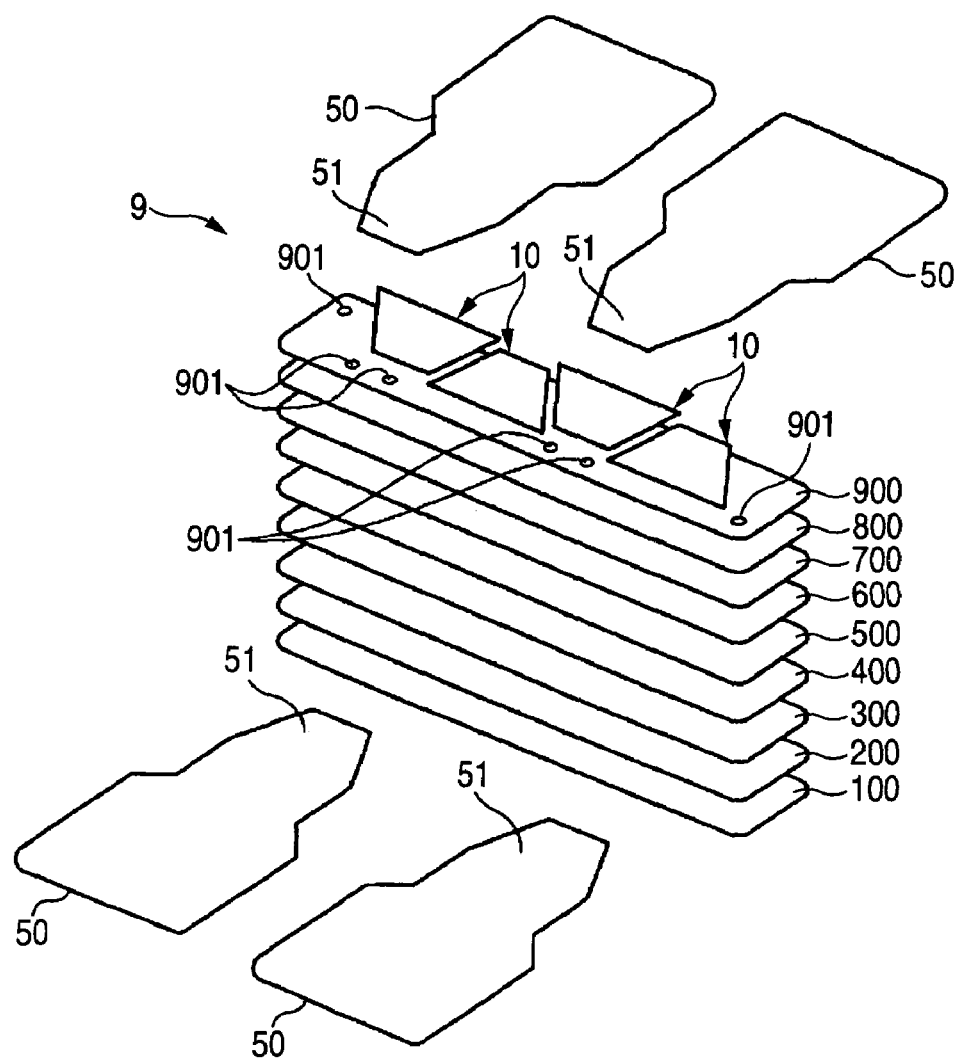
FIG. 2 is an exploded perspective view showing a rough structure of an ink-jet head 9.
Figure 3:
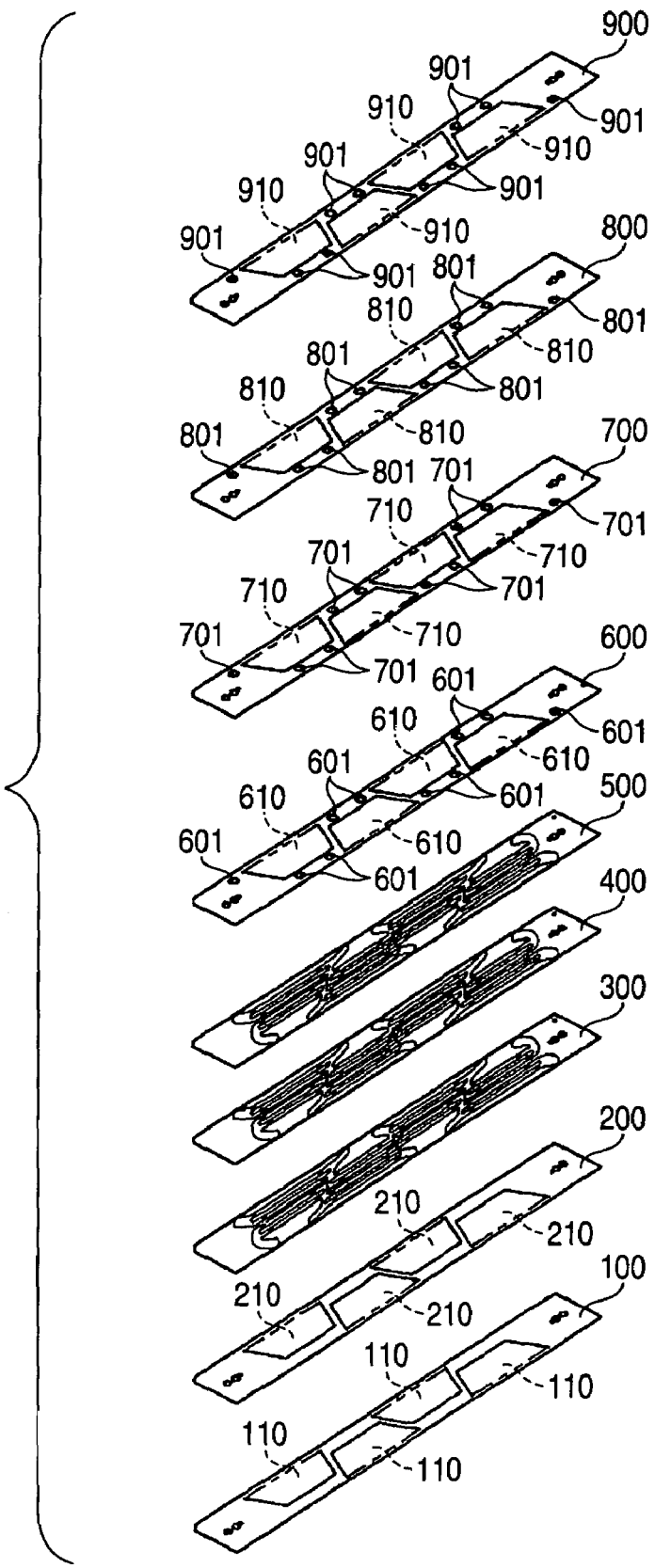
FIG. 3 is an exploded perspective view showing a laminate structure of the ink-jet head 9.
Figure 4:
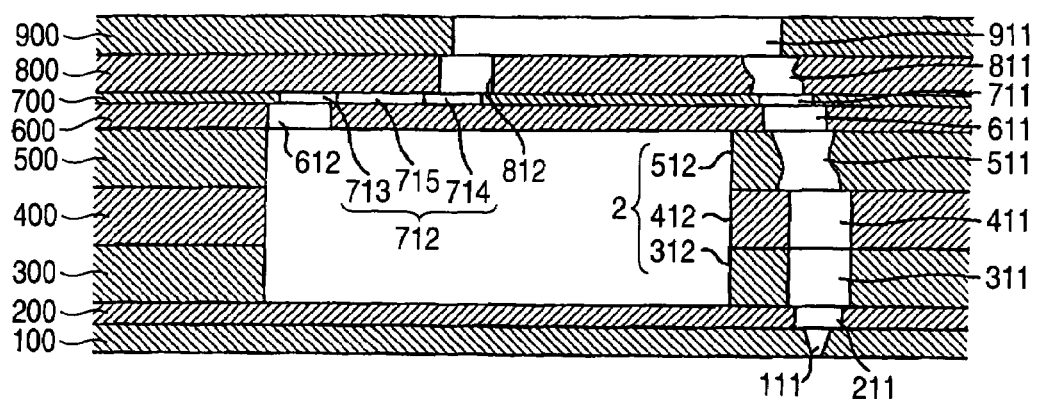
FIG. 4 is a schematic sectional view showing the laminate structure of the ink-jet head 9.

FIG. 2 is an exploded perspective view showing a rough structure of the ink-jet head 9 of the ink-jet printer 1. FIG. 3 is an exploded perspective view showing a laminate structure of the ink-jet head 9, and FIG. 4 is a schematic sectional view showing the laminate structure of the ink-jet head 9.

The ink-jet head 9 of this embodiment has such a structure that plural thin metal plates formed to be substantially rectangular are laminated. Specifically, the ink-jet head 9 baa a nine-layer structure in which the nine substantially rectangular thin metal plates are laminated, and has the structure in which as shown in FIGS. 2 to 4, a nozzle plate 100, a cover plate 200, a first manifold plate 300, a second manifold plate 400, a third manifold plate 500, a supply plate 600, an aperture plate 700, a base plate 800, and a cavity plate 900 are laminated in sequence from the lower layer.

Four plate-type piezoelectric sheets 10 with a substantially trapezoidal shape are alternately laminated on the surface (that is, upper surface) of the cavity plate 900 so that they do not overlap with each other. A tip part 51 of a flexible printed circuit board (hereinafter referred to as an "FPC" board) 50 is put on an upper side of each of the piezoelectric sheets 10, and is electrically connected to the piezoelectric sheet 10. Incidentally, in the cavity plate 900, ink supply ports 901 communicating with the ink tank 8 are provided around the respective laminated piezoelectric sheets 10.

Figure 5:
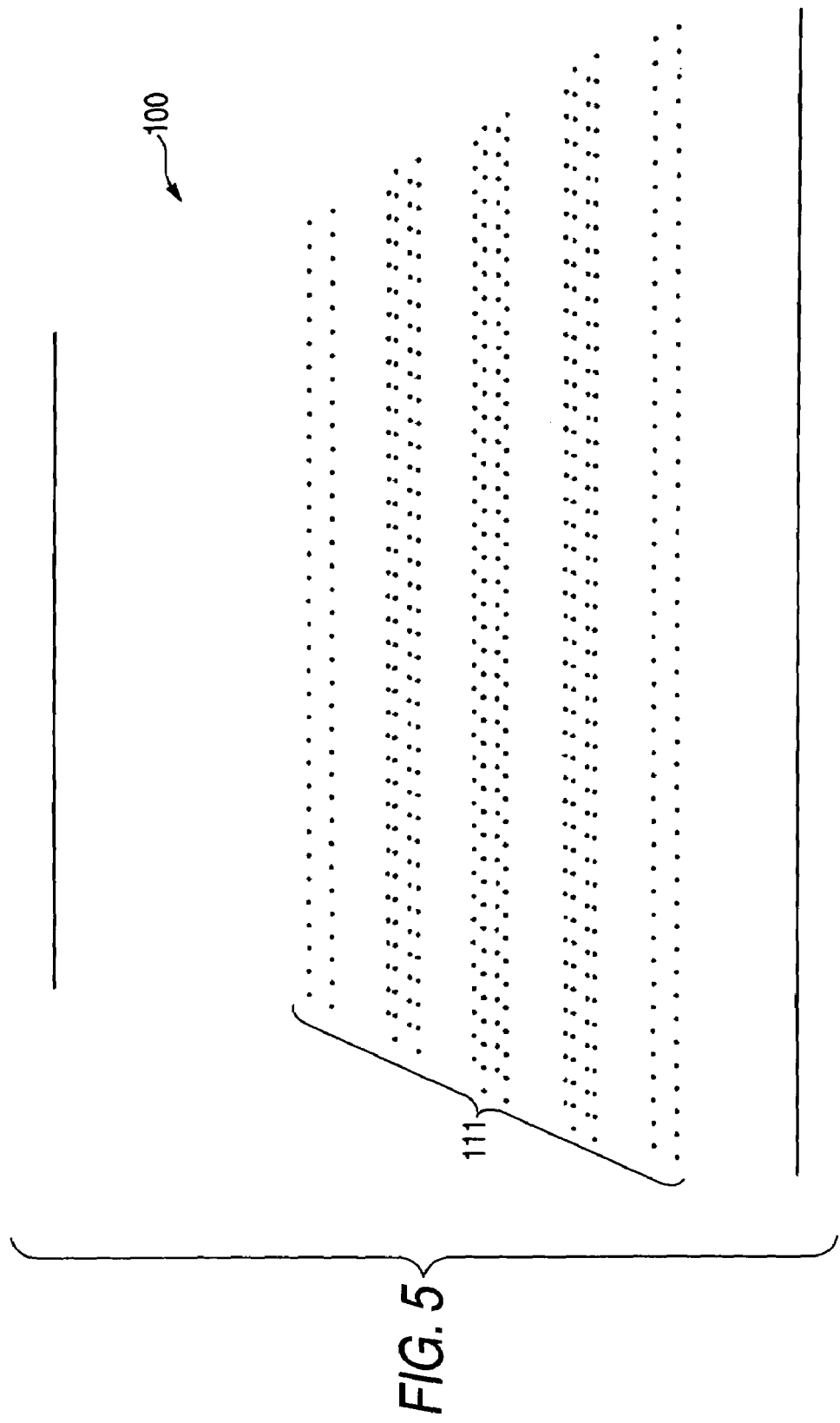
FIG. 5 is a plan view showing a structure of a nozzle plate 100.
Figure 6:
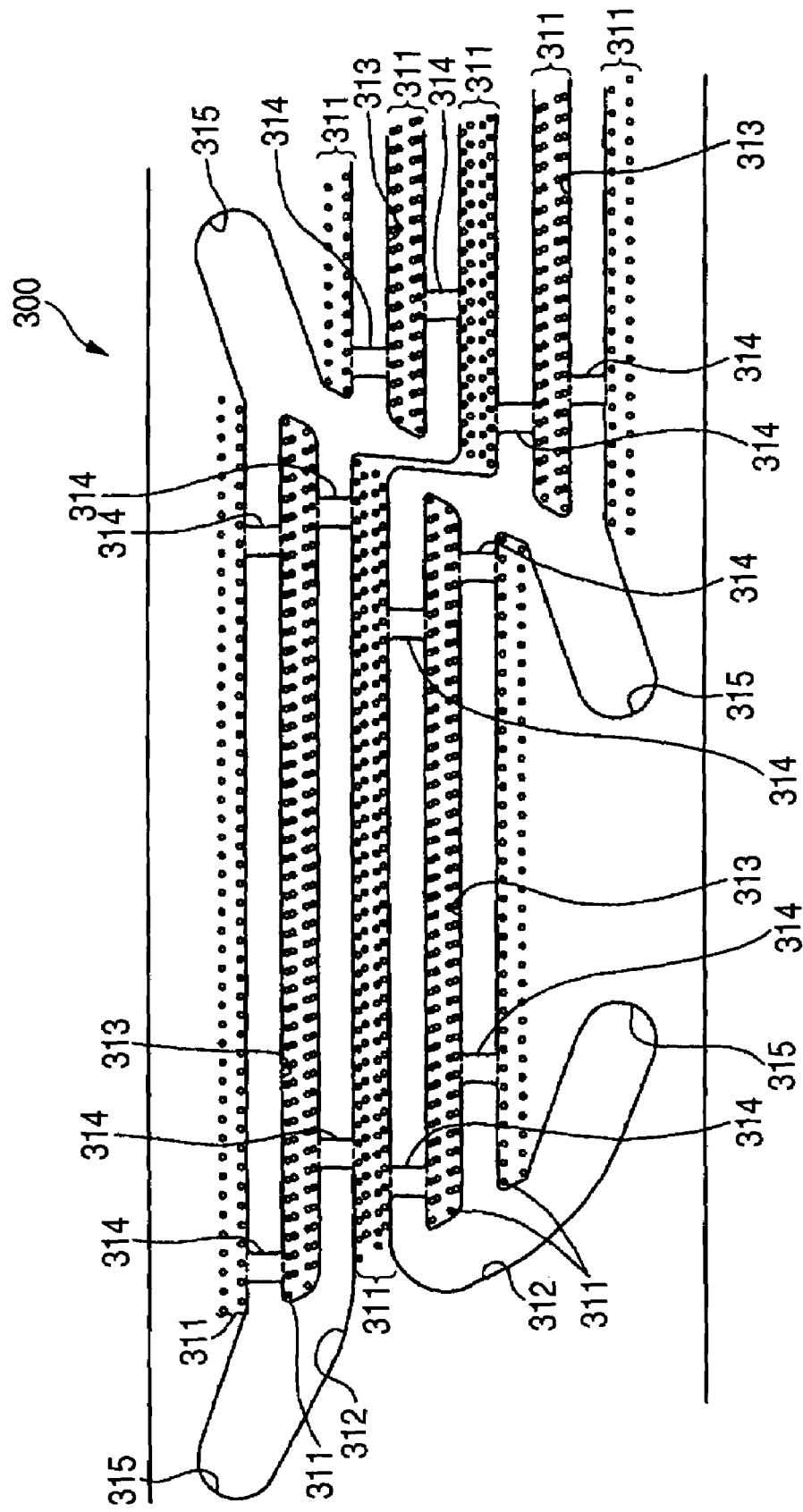
FIG. 6 is a plan view showing a structure of a surface of a first manifold plate 300.
Figure 7:
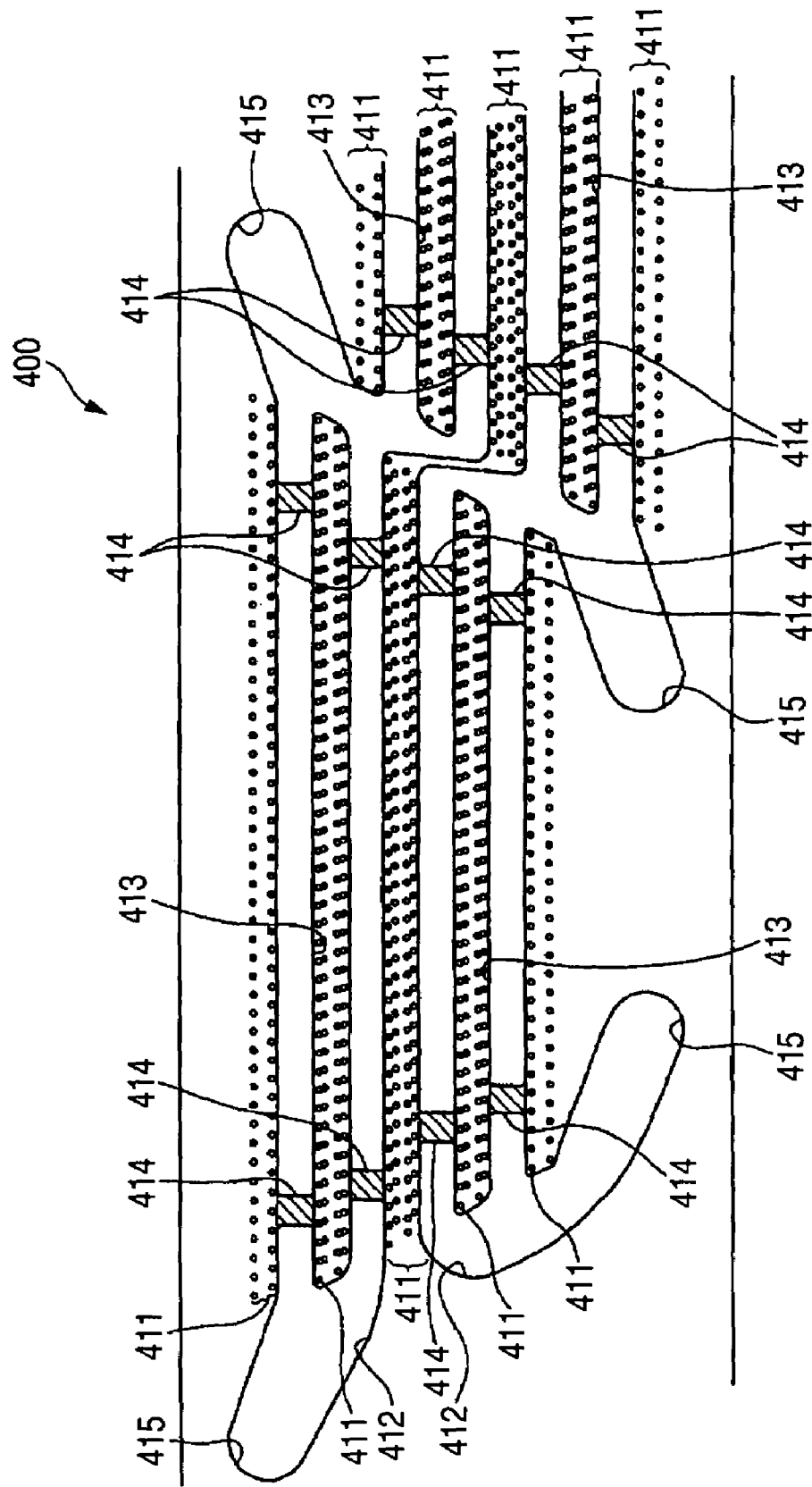
FIG. 7 is a plan view showing a structure of a surface of a second manifold plate 400.
Figure 8:
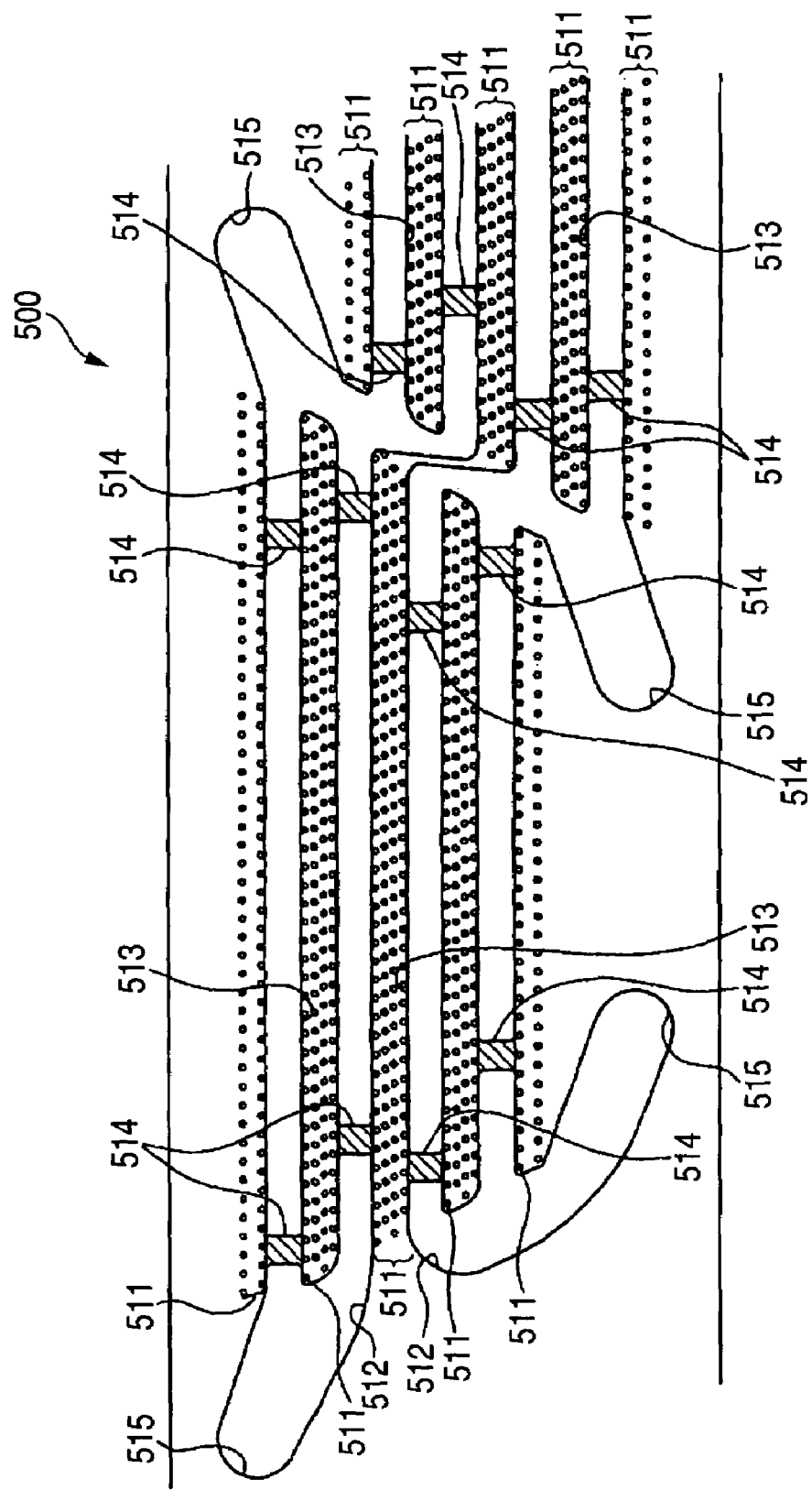
FIG. 8 is a plan view showing a structure of a surface of a third manifold plate 500.

Next, the respective plates will be described. FIG. 5 is a plan view showing a structure of the nozzle plate 100, and FIG. 6 is a plan view showing a structure of a surface of the first manifold plate 300. Besides, FIG. 7 is a plan view showing a structure of a surface of the second manifold plate 400, and FIG. 8 is a plan view showing a structure of a surface of the third manifold plate 500.

As shown in FIGS. 3 to 5, in the nozzle plate 100, each of four substantially trapezoidal areas 110 is made one group, and many ink jetting nozzles 111 with minute diameters are provided correspondingly to required print density. Besides, in the surface of the cover plate 200, each of four substantially trapezoidal areas 210 is made one group, and many minute diameter through holes 211 for ink passage are provided. The respective through holes 211 of the cover plate 200 are disposed at positions opposite to the respective nozzles 111 of the nozzle plate 100, and communicate with the respective nozzles 111 of the nozzle plate 100 when the cover plate 200 and the nozzle plate 100 are laminated.

Besides, in the first manifold plate 300, as shown in FIG. 6, many minute diameter through holes 311 for ink passage are provided. The respective through holes 311 are disposed at positions opposite to the respective through holes 211 of the cover plate 200 (see FIG. 4), and communicate with the respective through holes 211 of the cover plate 200 when the first manifold plate 300 and the cover plate 200 are laminated.

Besides, two groove through parts 312 constituting an ink manifold flow path 2 (see FIG. 4) are formed in the first manifold plate 300 in the longitudinal direction. Incidentally, the foregoing through holes 311 are displaced in the outer peripheries of the groove through parts 312 and in plural floating island parts 313 surrounded by the groove through parts 312.

Besides, the plural floating island parts 313 are constructed such that their lower sides are supported by plural half-etched coupling pieces 314, Incidentally, each of the coupling pieces 314 is formed to have a thickness about half that of the first manifold plate 300. Besides, plural ink supply parts 315 are provided to extend in the groove through parts 312.

On the other hand, as shown in FIG. 7, two groove through parts 412 constituting the ink manifold flow path 2 are formed in the second manifold plate 400 in the longitudinal direction. The respective groove through parts 412 of the second manifold plate 400 are disposed at positions opposite to the groove through parts 312 of the first manifold plate 300, and communicate with the groove through parts 312 of the first manifold plate 300 when the second manifold plate 400 and the first manifold plate 300 are laminated (see FIG. 4).

Besides, many minute diameter through holes 411 for ink passage are provided in outer peripheries of the groove through parts 412 and plural floating island parts 413 surrounded by the groove through parts 412. The respective through holes 411 of the second manifold plate 400 are disposed at positions opposite to the respective through holes 311 of the first manifold plate 300, and communicate with the respective through holes 311 of the first manifold plate 300 when the second manifold plate 400 and the first manifold plate 300 are laminated.

Besides, the plural floating island parts 413 are supported by plural coupling pieces 414 whose upper sides are half-etched. Incidentally, each of the coupling pieces 414 is formed to have a thickness about half that of the second manifold plate 400.

Besides, plural ink supply parts 415 are provided to extend in the groove through parts 412. The ink supply parts 415 of the second manifold plate 400 are disposed at positions opposite to the ink supply parts 315 of the first manifold plate 300, and communicate with the ink supply parts 315 of the first manifold plate 300 When the second manifold plate 400 and the first manifold plate 300 are laminated.

Besides, as shown in FIG. 8, two groove through parts 512 constituting the ink manifold flow path 2 is formed in the third manifold plate 500 and in the longitudinal direction. The respective groove through parts 512 of the third manifold plate 500 are disposed at positions opposite to the respective groove through parts 412 of the second manifold plate 400, and communicate with the respective groove through parts 412 of the second manifold plate 400 when the third manifold plate 500 and the second manifold plate 400 are laminated.

Besides, many minute diameter through holes 511 for ink passage are provided in the outer peripheries of the groove through parts 512 and plural floating island parts 513 surrounded by the groove through parts 512. The respective through holes 511 of the third manifold plate 500 are disposed at positions substantially opposite to the through holes 411 of the second manifold plate 400, and communicate with the through holes 411 of the second manifold plate 400 when the third manifold plate 500 and the second manifold plate 400 are laminated.

Besides, the plural floating island parts 513 have such structure that they are supported by plural coupling pieces 514 whose upper sides are half-etched. Incidentally, each of the coupling pieces 514 is formed to have a thickness about half that of the third manifold plate 500.

Besides, plural ink supply parts 515 are provided to extend in the groove through parts 512. The respective ink supply parts 515 of this third manifold plate 500 are disposed at positions opposite to the ink supply parts 415 of the second manifold plate 400, and communicate with ink the supply parts 415 of the second manifold plate 400 when the third manifold plate 500 and the second manifold plate 400 are laminated.

Figure 9A:
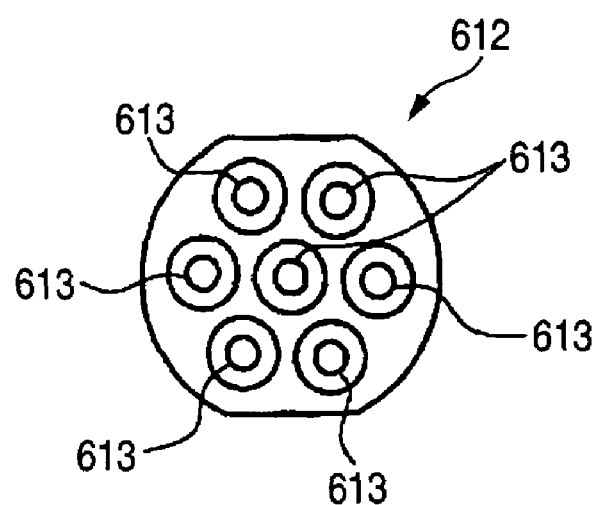
FIG. 9A is an enlarged plan view showing a structure of a through hole 612 for ink introduction provided in a supply plate 600.
Figure 9B:
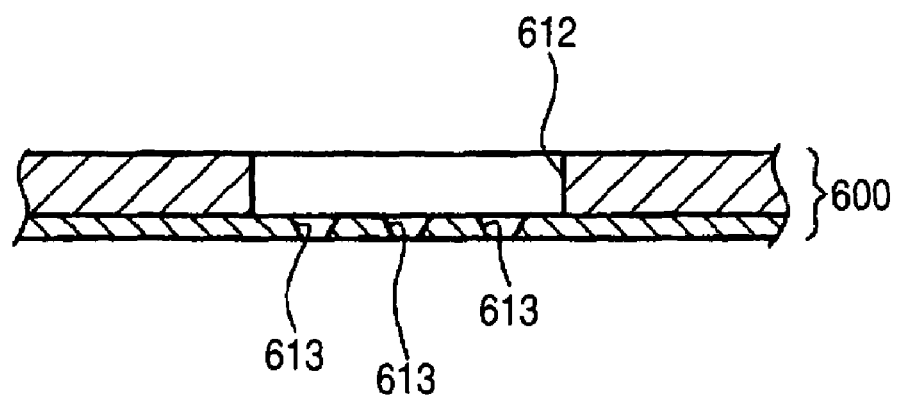
FIG. 9B is an enlarged sectional view showing the structure of the through hole 612.
Figure 10:
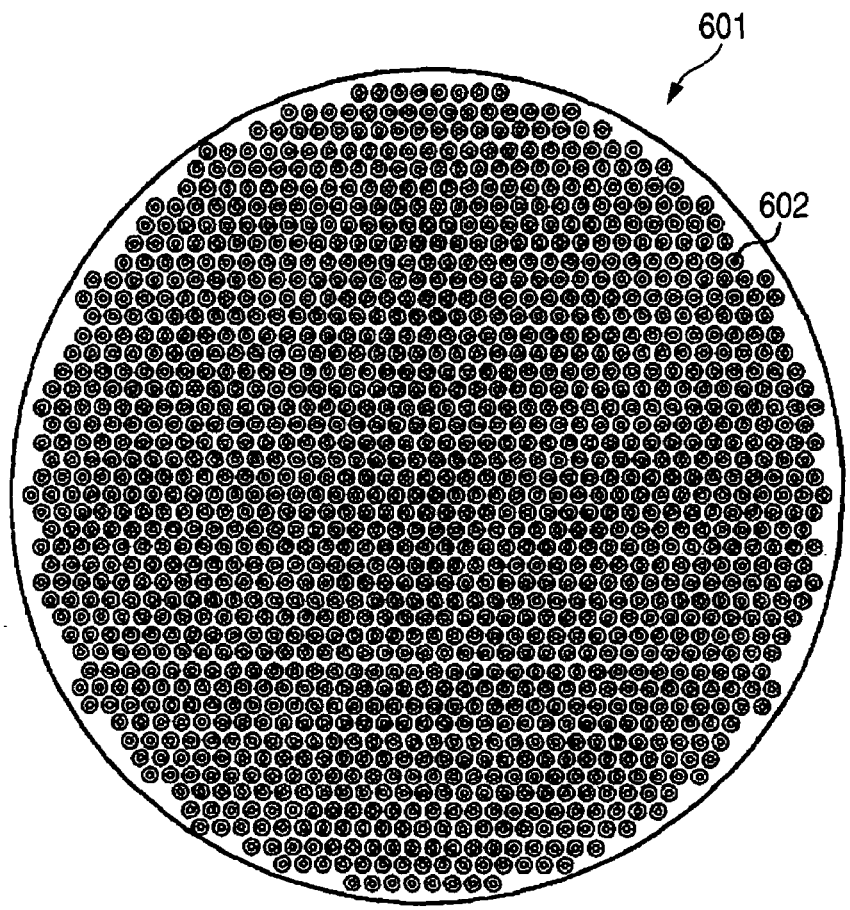
FIG. 10 is an enlarged plan view showing a structure of an ink supply port 601 provided in the supply plate 600.
Figure 11:
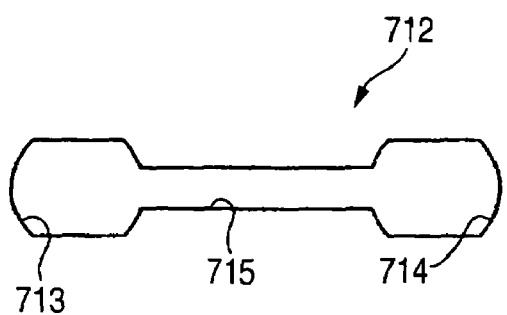
FIG. 11 is a plan view showing a structure of a squeezed part 712 for ink introduction provided in an aperture plate 700.
Figure 12:
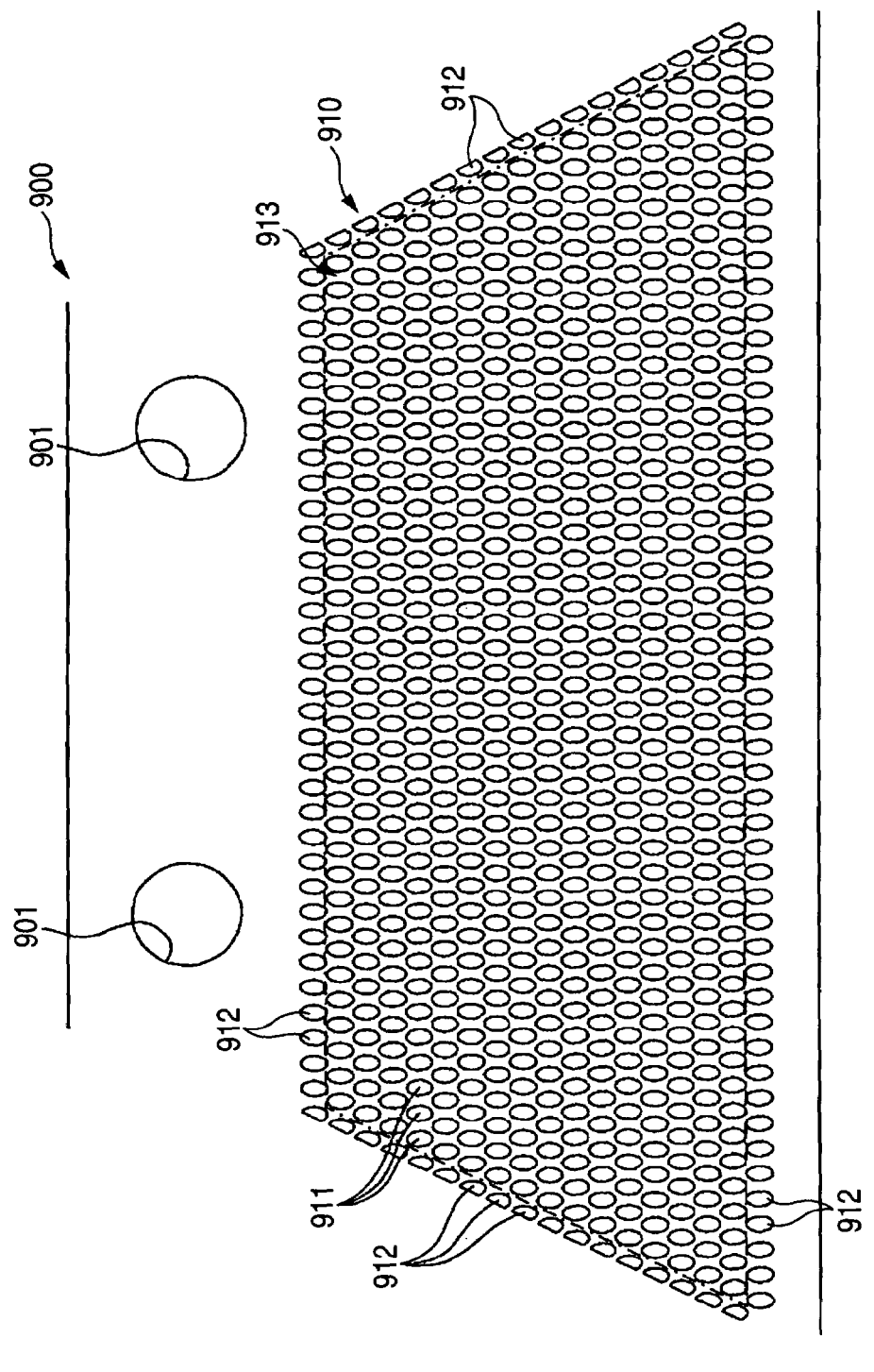
FIG. 12 is a plan view showing a structure of a surface of a cavity plate 900.

Subsequently, the supply plate 600, the aperture plate 700, the base plate 800 and the cavity plate 900 will be described. Incidentally, FIG. 9A is an enlarged plan view of a through hole 612 provided in the supply plate 600 and FIG. 9B is an enlarged sectional view thereof. FIG. 10 is an enlarged plan view of an ink supply port 601 provided in the supply plate 600. FIG. 11 is a plan view showing a structure of a squeezed part 712 for ink introduction provided in the aperture plate 700. Besides, FIG. 12 is a plan view showing a structure of a surface of the cavity plate 900.

In the supply plate 600, each of four substantially trapezoidal areas 610 (see FIG. 3) is made one group, and many minute diameter through holes 611 for ink passage and many minute diameter through holes 612 for ink introduction are provided (see FIG. 4). In each of the through holes 612 of the supply plate 600, as shown in FIG. 9, many filter holes 613 for preventing the entry of dust in the ink are provided.

The respective through holes 611 of the supply plate 600 are disposed at positions opposite to the through holes 511 of the third manifold plate 500, and communicate with the through holes 511 of the third manifold plate 500 when the supply plate 600 and the third manifold plate 500 are laminated.

On the other hand, the respective through holes 612 of the supply plate 600 are disposed at positions opposite to one of the two groove through parts 512 of the third manifold plate 500, and communicate with the one of the two groove through parts 512 of the third manifold plate 500 when the supply plate 600 and the third manifold plate 500 are laminated.

Besides, in the supply plate 600, the plural small diameter ink supply ports 601 for ink supply are provided at the outsides of the four substantially trapezoidal areas 610 (see FIG. 3). The respective ink supply ports 601 of the supply plate 600 are disposed at positions opposite to the respective ink supply parts 515 of the third manifold plate 500, and communicate with the respective ink supply parts 515 of the third manifold plate 500 when the supply plate 600 and the third manifold plate 500 are laminated. Besides, in each of the ink supply ports 601 of the supply plate 600, as shown in FIG. 10, many filter holes 602 for preventing the entry of dust in the ink are provided.

Besides, in the aperture plate 700, each of four substantially trapezoidal areas 710 is made one group, and as shown in FIG. 4, many minute diameter through holes 711 for ink passage and many squeezed parts 712 for ink introduction are provided. The respective through holes 711 of the aperture plate 700 are disposed at positions opposite to the respective through holes 611 of the supply plate 600, and communicate with the respective through holes 611 of the supply plate 600 when the aperture plate 700 and the supply plate 600 are laminated.

On the other hand, as shown in FIG. 11, each of the squeezed parts 712 of the aperture plate 700 is constituted by an ink inlet 713, an ink outlet 714, and a groove through part 715 for connecting the ink inlet 713 and the ink outlet 714. The ink inlet 713 of each of the squeezed parts 712 is disposed at a position substantially opposite to each of the through holes 612 of the supply plate 600, and communicates with each of the through holes 612 of the supply plate 600 when the aperture plate 700 and the supply plate 600 are laminated.

Besides, in the aperture plate 700, plural ink supply ports 701 for ink supply are provided at the outsides of the four substantially trapezoidal areas 710 (see FIG. 3). The respective ink supply ports 701 of the aperture plate 700 are disposed at positions opposite to the respective ink supply ports 601 of the supply plate 600, and communicate with the ink supply ports 601 of the supply plate 600 when the aperture plate 700 and the supply plate 600 are laminated.

Besides, in the base plate 800, each of four substantially trapezoidal areas 810 is made one group, and many minute diameter through holes 811 for ink passage and many minute diameter through holes 812 for ink introduction are provided. The respective through holes 811 of the base plate 800 are disposed at positions opposite to the respective through holes 711 of the aperture plate 700, and communicate with the respective through holes 711 of the aperture plate 700 when the base plate 800 and the aperture plate 700 are laminated.

On the other hand, the respective through holes 812 of the base plate 800 are disposed at positions opposite to the ink outlets 714 of the respective squeezed parts 712 of the aperture plate 700, and communicate with the ink outlets 714 of the respective squeezed parts 712 of the aperture plate 700 when the base plate 800 and the aperture plate 700 are laminated.

Besides, in the base plate 800, plural ink supply ports 801 for ink supply are provided at the outsides of the four substantially trapezoidal areas 810 (see FIG. 3). The respective ink supply ports 801 are disposed at positions opposite to the respective ink supply ports 701, and communicate with the respective ink supply ports 701 of the aperture plate 700 when the base plate 800 and the aperture plate 700 are laminated.

Besides, in the cavity plate 900, each of four substantially trapezoidal areas 910 is made one group, and many ink pressure chambers 911 and 912 having opening ends at the piezoelectric sheets 10 and the base plate 800 side are provided in a matrix form correspondingly to a required print density (see FIG. 12). That is, the respective ink pressure chambers 911 and 912 of the cavity plate 900 are disposed at equal intervals in the longitudinal direction and the horizontal direction.

The ink pressure chambers 912 are so-called dummy ink pressure chambers having substantially the same shape as the ink pressure chambers 911, and are formed at the outer periphery of an ink filling area 913 in which the ink pressure chambers are disposed, similarly to the true ink pressure chambers 911 filled with ink.

The tip parts of the respective ink pressure chambers 911 except for the dummy ink pressure chambers 912 are disposed at positions substantially opposite to the respective through holes 811 of the base plate 800, and communicate with the respective through holes 811 of the base plate 800 when the cavity plate 900 and the base plate 800 are laminated (see FIG. 4). That is, the number of the ink pressure chambers 911 is equal to that of the through holes 811 of the base plate 800.

On the other hand, the rear end parts of the respective ink pressure chambers 911 are disposed at positions opposite to the respective through holes 812 of the base plate 800, and communicate with the respective through holes 812 of the base plate 800 when the cavity plate 900 and the base plate 800 are laminated.

Besides, in the cavity plate 900, plural ink supply ports 901 for ink supply are provided at the outsides of the four substantially trapezoidal areas 910. The respective ink supply ports 901 of the cavity plate 900 are disposed at positions opposite to the respective ink supply ports 801 of the base plate 800, and communicate with the respective ink supply ports 801 of the base plate 800 when the cavity plate 900 and the base plate 800 are laminated. Incidentally, the back surfaces of the square piezoelectric sheets 10 are joined to the surface of the cavity plate 900.

Figure 13:
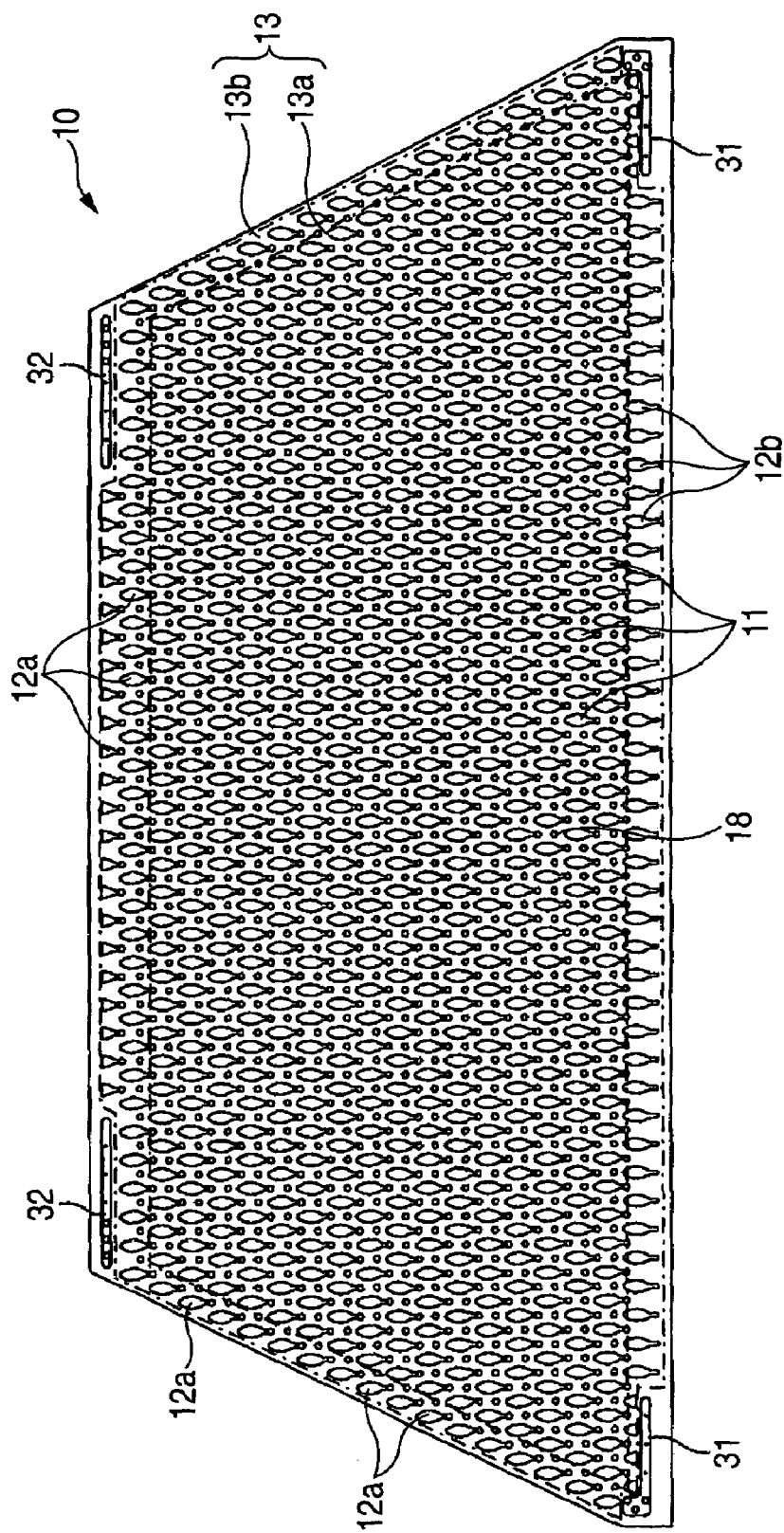
FIG. 13 is a plan view showing a structure of a surface of a piezoelectric sheet 10.
Figure 14A:
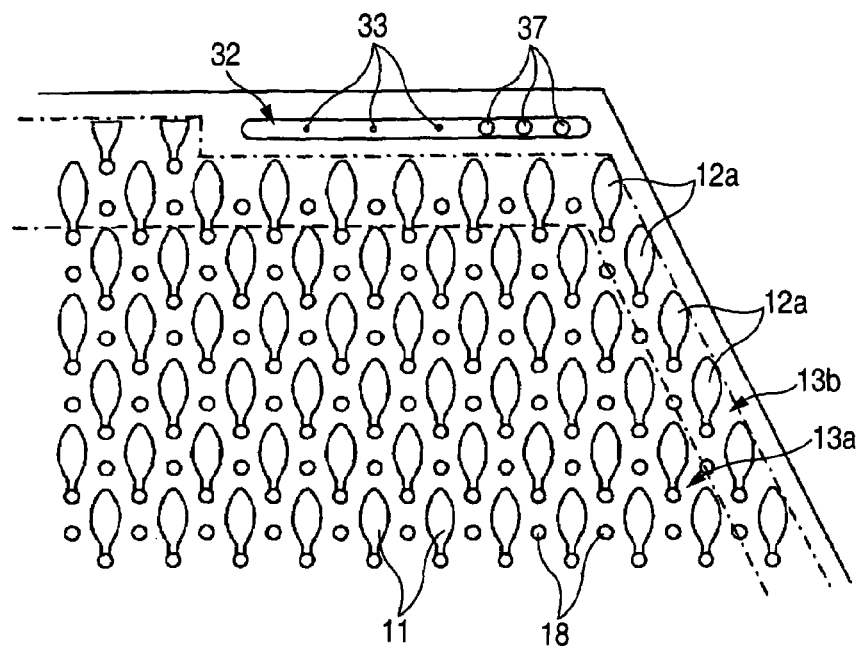
FIG. 14A is an enlarged plan view of a right tip part of the surface of the piezoelectric sheet 10.
Figure 14B:
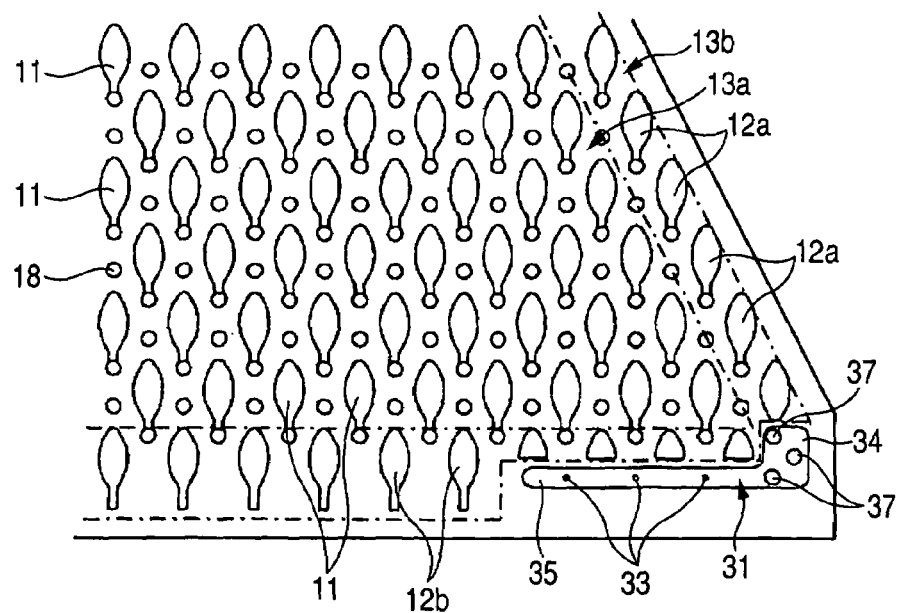
FIG. 14B is an enlarged plan view of a right rear end part.
Figure 15A:
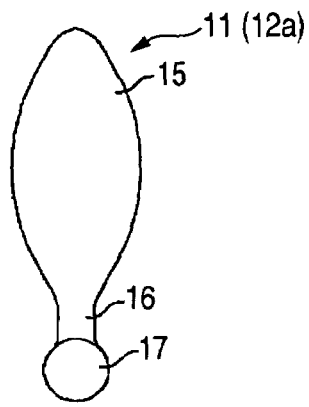
FIG. 15A is an enlarged plan view of an individual electrode 11, 12a formed on the piezoelectric sheet 10.
Figure 15B:
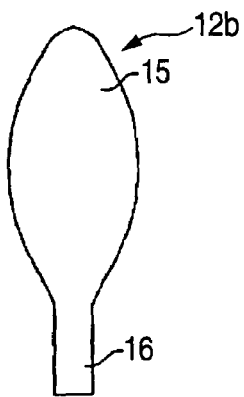
FIG. 15B is an enlarged plan view of an individual electrode 12b.
Figure 16A:
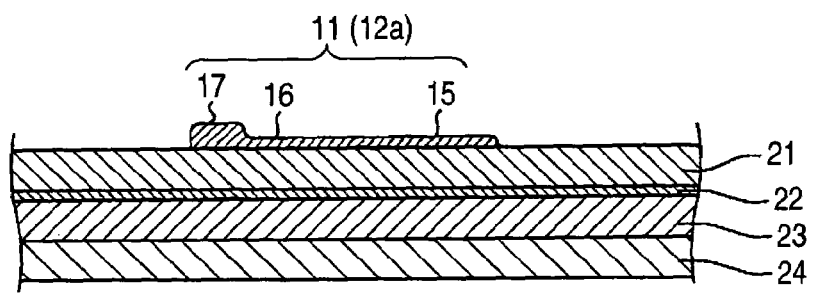
FIG. 16A is an enlarged sectional view of the individual electrode 11, 12a of the piezoelectric sheet 10.
Figure 16B:
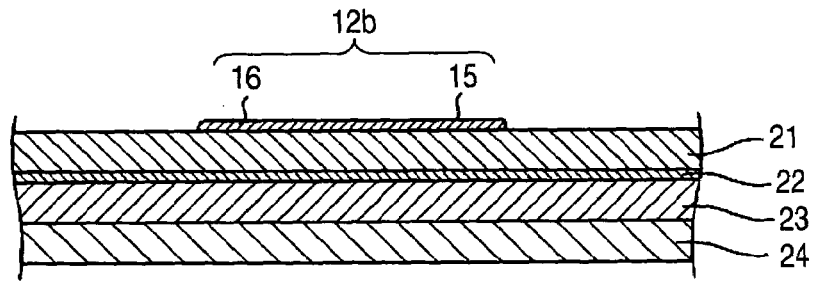
FIG. 16B is an enlarged sectional view of the individual electrode 12b.

Next, the piezoelectric sheet 10 will be described. Incidentally, FIG. 13 is a plan view showing a structure of a surface of the piezoelectric sheet 10, FIG. 14A is an enlarged plan view of a right tip part of the surface of the piezoelectric sheet 10, and FIG. 14B is an enlarged plan view of a right rear end part. Besides, FIG. 15A is an enlarged plan view of an individual electrode 11, 12a formed on the piezoelectric sheet 10, and FIG. 15B is an enlarged plan view of an individual electrode 12b. FIG. 16A is an enlarged sectional view of the individual electrode 11, 12a of the piezoelectric sheet 10, and FIG. 16B is an enlarged sectional view of the individual electrode 12b.

Figure 17:
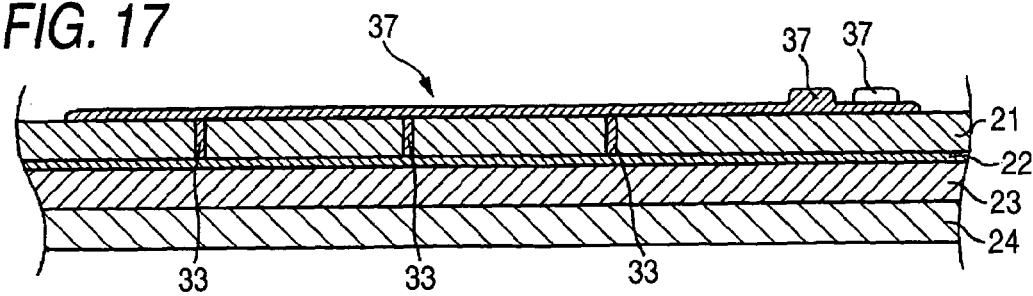
FIG. 17 is an enlarged sectional view showing a structure of a common electrode 31 formed on the piezoelectric sheet 10.
Figure 18:
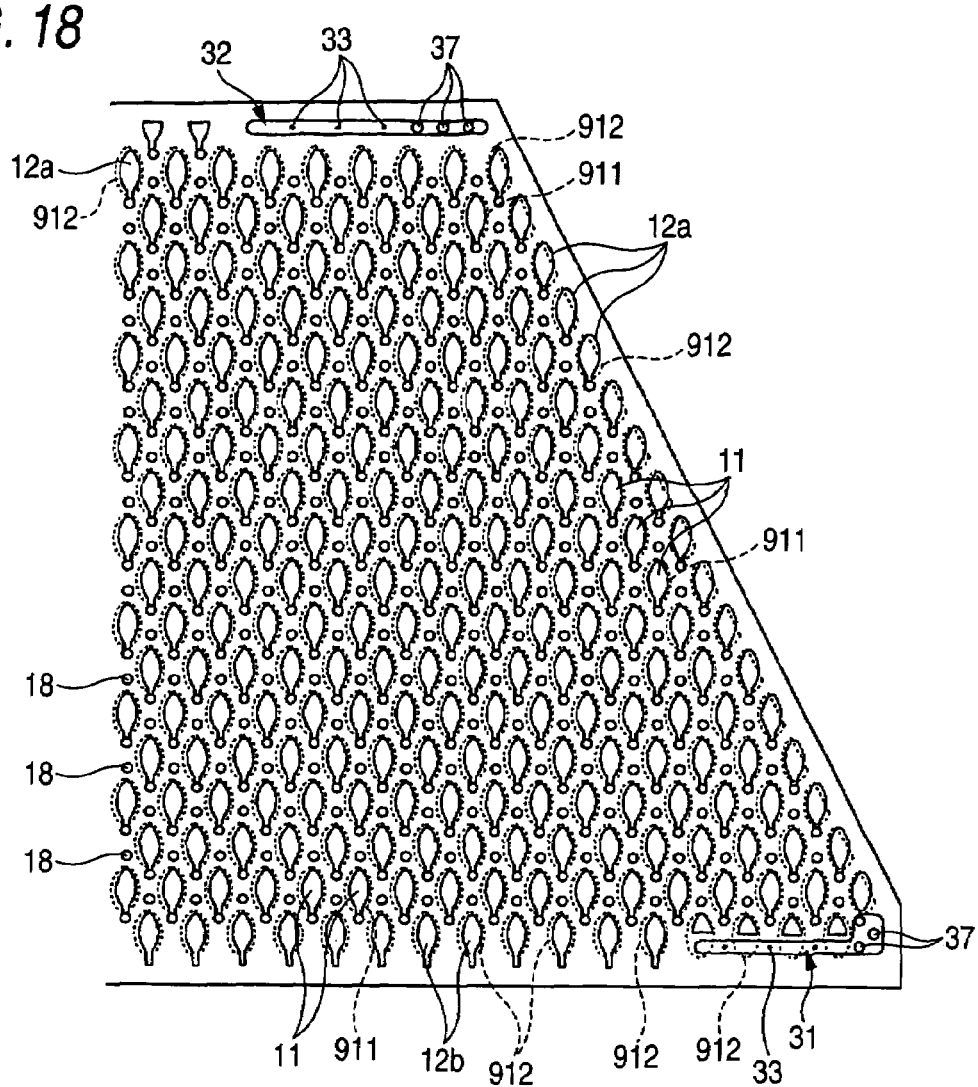
FIG. 18 is a partially translucent plan view of the piezoelectric sheet 10 showing a positional relation of ink pressure chambers 911 and dummy ink pressure chambers 912 provided in the cavity plate 900 with respect to various electrodes provided on the piezoelectric sheet 10.
Figure 19:
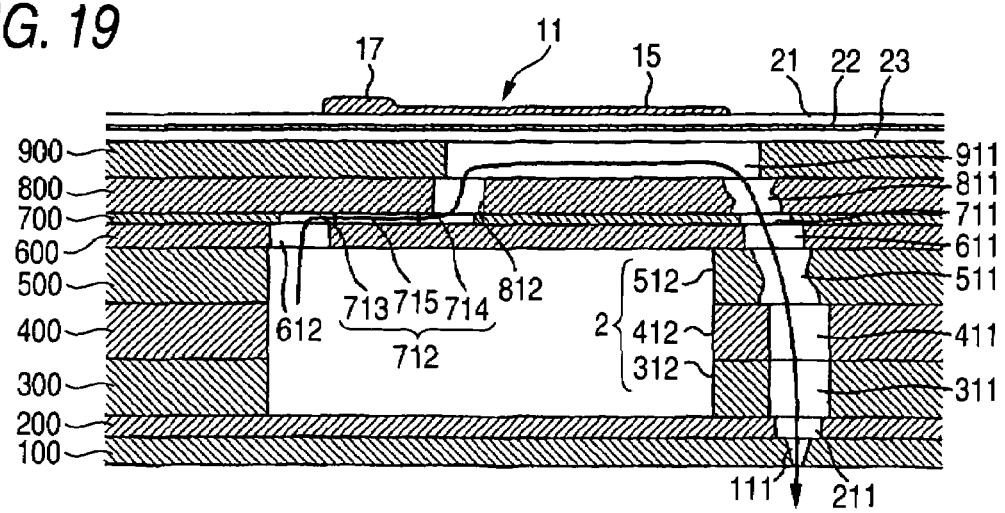
FIG. 19 is a sectional view showing a structure of the ink-jet head 9 before an FPC board 50 is put.

Besides, FIG. 17 is an enlarged sectional view showing a structure of a common electrode 31 formed on the piezoelectric sheet 10, and FIG. 18 is a partially translucent plan view of the piezoelectric sheet 10 showing the positional relation among the ink pressure chambers 911 and the dummy ink pressure chambers 912 provided in the cavity plate 900, and the various electrodes provided on the piezoelectric sheet 10. Besides, FIG. 19 is a sectional view showing a structure of the ink-jet head 9 before the FPC board 50 is put.

As shown in FIG. 13, in the piezoelectric sheet 10 of this embodiment, the many individual electrodes 11, 12a and 12b are formed in a matrix form correspondingly to the required print density. The respective individual electrodes 11 of the piezoelectric sheet 10 are disposed at positions opposite to the respective ink pressure chambers 911 of the cavity plate 900, and when the piezoelectric sheet 10 is laminated on the cavity plate 900, and the upper parts of the respective ink pressure chambers 911 and 912 of the cavity plate 900 are blocked by the piezoelectric sheet 10, the respective individual electrodes 11 are disposed at the upper parts of the respective ink pressure chambers 911 of the cavity plate 900 (see FIGS. 18 and 19). Besides, the respective individual electrodes 12a and 12b are disposed at positions opposite to the respective ink pressure chambers 912 of the cavity plate 900, and are disposed at the upper parts of the respective ink pressure chambers 912 of the cavity plate 900 when the piezoelectric sheet 10 is laminated on the cavity plate 900.

Incidentally, the individual electrodes 12a and 12b are so-called dummy individual electrodes having substantially the same shape as the individual electrodes 11. Similarly to the true individual electrodes 11 for pressing the ink in the ink pressure chambers 911 when drive voltage is applied, the individual electrodes 12a and 12b are formed in a non-drive area 13b positioned at the outer periphery of a drive area 13a in which the individual electrodes 11 are disposed. That is, the individual electrodes 11, 12a, and 12b are disposed at equal intervals with the same pattern in an individual electrode formation area 13 composed of the drive area 13a provided at the center part of the piezoelectric sheet 10 and the non-drive area 13b. Incidentally, the outside of the individual electrode formation area 13 is an area where the individual electrodes 11, 12a and 12b are not formed, and at the boundary of the individual electrode formation area 13, part of the individual electrodes 12a and 12b are made to be notch-shaped.

Besides, in each of the dummy individual electrodes 12a except for the individual electrodes 12b positioned at the lower bottom of the piezoelectric sheet 10 and in each of the individual electrodes 11 of the piezoelectric sheet 10, a convex contact land part 17 is formed at an end of an extension part 16 extending from an opposite part 15 of the individual electrode 11, 12a forming a surface opposite to the ink pressure chamber 911, 912 (see FIGS. 15 and 16).

Besides, although the individual electrode 12b positioned at the lower bottom of the trapezoidal piezoelectric sheet 10 is constituted by an opposite part 15 and an extension part 16 having the same shape as the individual electrode 11, 12a, the extension part 16 does not have a contact land part 17.

Incidentally, the contact land part 17 of the individual electrode 11, 12a is provided on a joint surface SS between the piezoelectric sheet 10 as the peripheral area of each of the ink pressure chambers 911 and 912 of the cavity plate 900 and the cavity plate 900. That is, the contact land part 17 is formed at a position outside the area of the piezoelectric sheet 10 opposite to each of the ink pressure chambers 911 and 912.

Besides, as shown in FIG. 16, the piezoelectric sheet 10 of this embodiment has such a structure that a first piezoelectric layer 21 and second piezoelectric layers 23 and 24 are laminated, and includes an internal electrode 22 between the first piezoelectric layer 21 and the second piezoelectric layer 23, which is opposite to the individual electrodes 11, 12a and 12b. The internal electrode 22 is electrically connected to common electrodes 31 and 32 as a conductor pattern formed on the surface of the piezoelectric sheet 10 via plural through holes 33 positioned at four corner parts of the trapezoid and filled with conductive material.

Besides, the respective common electrodes 31 and 32 are provided in corner areas of the piezoelectric sheet 10, which are not included in the individual electrode formation area 13 where the individual electrodes 11, 12a and 12b are formed on the surface of the piezoelectric sheet 10.

The corner areas are non-individual electrode formation areas where the individual electrodes 11, 12a and 12b are not formed, the common electrodes 31 are respectively provided at the corner parts of the lower bottom side (that is, rear end side in the extension direction of the board 50) of the piezoelectric sheet 10 formed to be trapezoidal, and the common electrodes 32 are provided at the corner parts of the upper bottom side (that is, tip side) of the piezoelectric sheet 10.

The common electrode 31 is formed to be substantially L-shaped by a board side connection part 34 in which plural convex contact land parts 37 are formed and an internal electrode side connection part 35 linearly extended from the board side connection part 34, and the three through holes 33 are provided to extend from the internal electrode aide connection part 35 to the internal electrode 22. Specifically, the three contact land parts 37 are disposed to form a triangular shape (that is, positioned at apexes of a triangle).

On the other hand, the common electrode 32 is made linear, and has such a structure that plural convex contact land parts 37 are disposed at the corner part side of the piezoelectric sheet 10 and along the tip edge (side at the upper bottom side) of the piezoelectric sheet 10. Besides, the common electrode 32 is connected to plural (specifically, three) through holes 33 at the opposite side to the corner part of the piezoelectric sheet 10, and is electrically connected to the internal electrode 22 of the piezoelectric sheet 10 via the through holes 33. Incidentally, the contact land parts 37 of the common electrodes 31 and 32 are provided on the joint surface SS (that is, the positions outside the ink pressure chambers 911 and 912) between the cavity plate 900 positioned around the ink pressure chambers 911 and 912 and the piezoelectric sheet 10.

Besides, in the piezoelectric sheet 10, projection parts 18 for realizing uniform joint between the cavity plate 900 and the piezoelectric sheet 10 by transmitting the press force to the joint surface SS between the cavity plate 900 and the piezoelectric sheet 10 are provided among the contact land parts 17. Incidentally, the projection parts 18 and the contact land parts 17 and 37 are made to have the same shape and the same height in this embodiment.

Figure 21A:
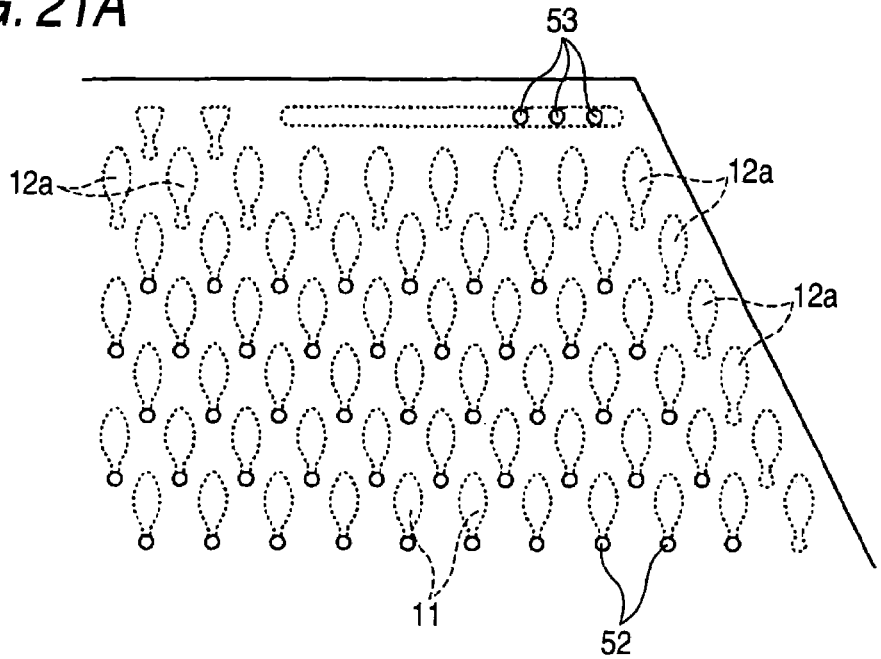
FIG. 21A is an enlarged plan view of a right tip part of a surface of the FPC board 50.
Figure 21B:
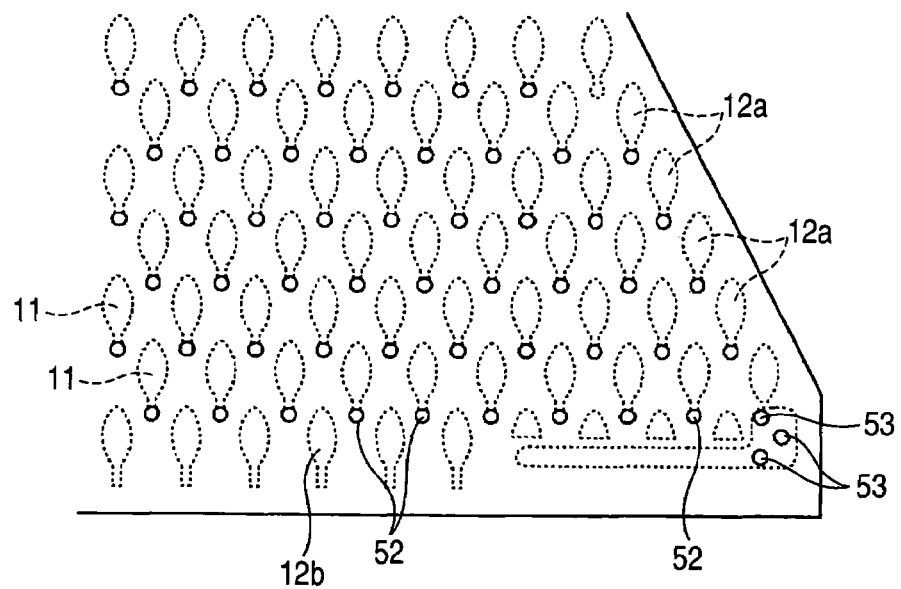
FIG. 21B is an enlarged plan view of a right rear end part thereof.
Figure 22:
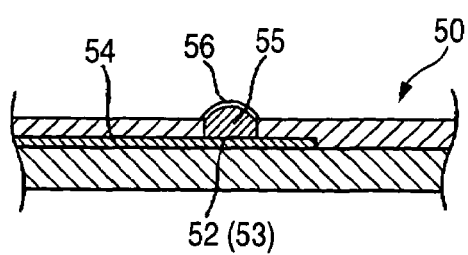
FIG. 22 is an enlarged sectional view of the FPC board 50 showing a rough structure of the pad 52, 53.

Next, a rough structure of the FPC board 50 will be described. Incidentally, FIG. 20 is a plan view of the FPC board 50 showing the arrangement of pads 52 and 53, FIG. 21A is an enlarged plan view of the right tip part of the surface of the FPC board 50, and FIG. 21B is an enlarged plan view of the right rear end part (in FIG. 21, the individual electrodes of the lower layer are shown in a translucent manner). Besides, FIG. 22 is an enlarged sectional view of the FPC board 50 showing a rough structure of the pad 52, 53 provided on the FPC board 50 and a wiring layer 54.

Figure 23A:
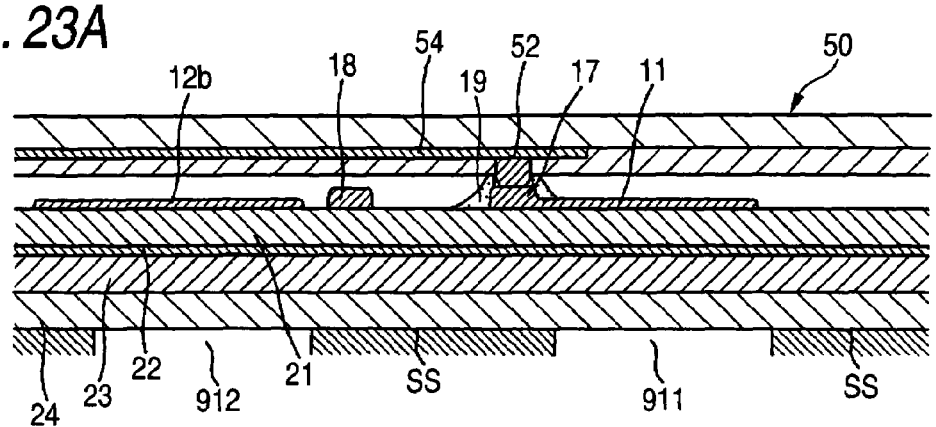
FIG. 23A is a sectional view showing a connection mode of the pad 52 of the FPC board 50 and the individual electrode 11 of the piezoelectric sheet 10.
Figure 23B:
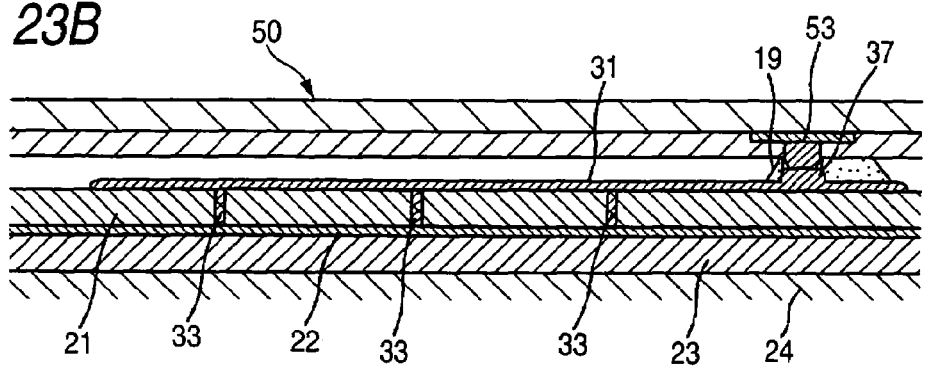
FIG. 23B is a sectional view showing a connection mode of the pad 53 of the FPC board 50 and the common electrode 32 of the piezoelectric sheet 10.
Figure 24:
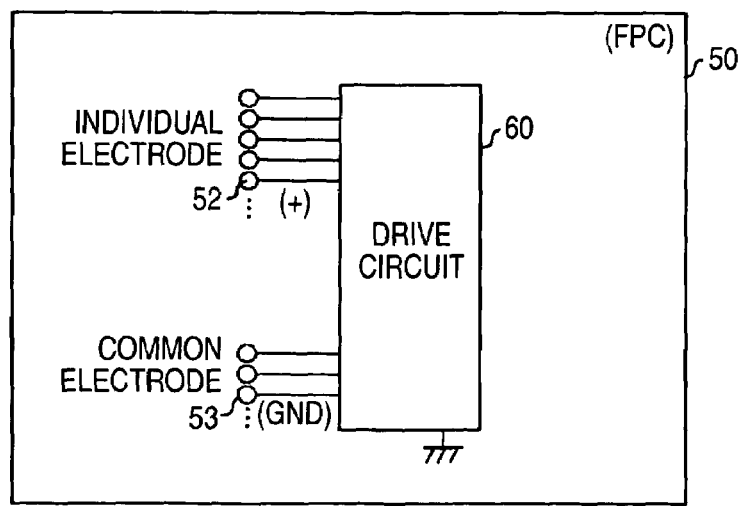
FIG. 24 is a block diagram for schematically showing an electrical structure of the FPC board 50.

Besides, FIG. 23A is a sectional view showing a connection mode of the pad 52 as the individual electrode of the FPC board 50 and the individual electrode 11 of the piezoelectric sheet 10, and FIG. 23B is a sectional view showing a connection mode of the pad 53 of the FPC board 50 and the common electrode 31, 32 of the piezoelectric sheet 10. Besides, FIG. 24 is a block diagram schematically showing an electrical structure of the FPC board 50.

The FPC board 50 includes therein the wiring layer 54, and the tip part 51 includes the pads 52 and 53 formed by partially exposing the conductor constituting the wiring layer 54. The pads 52 and 53 are disposed to have the same pattern as the contact land parts 17 and 37 of the piezoelectric sheet 10.

That is, the respective pads 52 are provided at positions opposite to the contact land parts 17 of the individual electrodes 11 of the piezoelectric sheet 10 (in other words, the contact land parts 17 other than the contact land parts of the individual electrodes 12a), and each of the pads 52 is provided with a nickel plating layer 55 joined to the contact land part 17 formed in the individual electrode 11 of the piezoelectric sheet 10 and a solder layer 56.

On the other hand, the respective pads 53 are provided at positions opposite to the contact land parts 37 of the common electrodes 31 and 32. Similarly to the pad 52, each of the pads 53 is provided with a nickel plating layer 55 joined to the contact land part 37 formed in the common electrode 31, 32 of the piezoelectric sheet 10 and a solder layer 56.

The FPC board 50 having the structure as stated above is put on the piezoelectric sheet 10, and when soldering is performed by thermo compression bonding, the respective pads 52 of the FPC board 50 are joined to the contact land parts 17 of the respective individual electrodes 11 of the piezoelectric sheet 10 via the solder layers 56, and are electrically connected to the opposite individual electrodes 11. On the other hand, the respective pads 53 are connected to the contact land parts 37 of the respective common electrodes 31 and 32 of the piezoelectric sheet 10 via the solder layers 56, and are electrically connected to the opposite common electrodes 31 and 32. Besides, by this soldering, the FPC board 50 is fixed to the piezoelectric sheet 10.

Incidentally, at this time, the periphery of each of joint parts of the respective individual electrodes 11 of the piezoelectric sheet 10 and the pads 52 is covered with an N.C.P 19 as an insulating resin applied to the individual electrode 11. Similarly, the periphery of each of joint parts of the respective common electrodes 31 and 32 of the piezoelectric sheet 10 and the pads 53 is covered with an N.C.P 19 as an insulating resin applied to the common electrode 31, 32. Besides, the individual electrodes 12a and 12b are not connected to the FPC board 50, but are put into an electrically non-connected state with the wiring layer 54 of the board 50.

As shown in FIG. 24, the FPC board 50 joined to the piezoelectric sheet 10 in this way includes a drive circuit 60, and the pads 53 are connected to the ground. Besides, under the control of the control part 3, the PC board applies positive drive voltage to the individual electrodes 11 of the piezoelectric sheet 10 through the pads 52, and drives the piezoelectric sheet 10.

When the drive voltage is applied to the individual electrodes 11 by this FPC board 50, the first piezoelectric layer 21 and the second piezoelectric layers 23 and 24 of the piezoelectric sheet 10 positioned just under the individual electrodes 11 to which the drive voltage is applied are deformed in the direction toward the ink pressure chamber 911, and presses the ink in the ink pressure chamber 911. By this, an ink droplet is discharged from the nozzle 111 communicating with the ink pressure chamber 911.

Next, the flow of ink in the ink-jet head 9 will be described.

As shown in FIG. 1, when the nozzle plate 100, the cover plate 200, the first manifold plate 300, the second manifold plate 400, the third manifold plate 500, the supply plate 600, the aperture plate 700, the base plate 800, the cavity plate 900, and the piezoelectric sheet 10 are laminated in sequence from the lower layer, the flow path of ink discharged from the nozzle 111 of the nozzle plate 100 is as shown in the sectional view of FIG. 19.

The ink to be discharged from the nozzle 111 of the nozzle plate 100 is first supplied from the ink tank 8 to the ink manifold flow path 2. Incidentally, the ink supply from the ink tank 8 to the ink manifold flow path 2 is performed through an ink supply path in which the ink supply port 901 of the cavity plate 900, the ink supply port 801 of the base plate 800, the ink supply port 701 of the aperture plate 700, the ink supply port 601 of the supply plate 600, the ink supply part 515 of the third manifold plate 500, the ink supply part 415 of the second manifold plate 400, and the ink supply part 315 of the first manifold plate 300 are communicated with each other. At this time, in the ink supply port 601 of the supply plate 600, dust in the ink is removed by the filter holes 602.

The ink manifold flow path 2 is formed of the groove through part 512 of the third manifold plate 500, the groove through part 412 of the second manifold plate 400, and the groove through part 312 of the first manifold plate 300. The ink flowing through the ink manifold flow path 2 is introduced into the ink pressure chamber 911 of the cavity plate 900 through the through hole 612 of the supply plate 600, the ink inlet 713 of the squeezed part 712 of the aperture plate 700, the groove through part 715, the ink outlet 714, and the through hole 812 of the base plate 800. At this time, in the through hole 612 of the supply plate 600, dust in the ink is removed by the filter holes 613.

When drive voltage is applied to the individual electrode 11 of the piezoelectric sheet 10 through the FPC board 50 in the state as stated above, the piezoelectric sheet 10 is deformed toward the side of the ink pressure chamber 911 of the cavity plate 900. Then, at this time, the ink in the ink pressure chamber 911 of the cavity plate 900 is pressed out to the through hole 811 of the base plate 800.

The ink pressed out to the through hole 811 of the base plate 800 is discharged from the nozzle 111 of the nozzle plate 100 through the through hole 811 of the base plate 800, the through hole 711 of the aperture plate 700, the through hole 611 of the supply plate 600, the through hole 511 of the third manifold plate 500, the through hole 411 of the second manifold plate 400, the through hole 311 of the first manifold plate 300, and the through hole 211 of the cover plate 200.

Subsequently, a method of manufacturing the ink-jet head 9 having the above structure will be described. Incidentally, since a method of manufacturing the nozzle plate 100, the cover plate 200, the first manifold plate 300, the second manifold plate 400, the third manifold plate 500, the supply plate 600, the second aperture plate 700, the base plate 800, and the cavity plate 900 is well known, the detailed description of their manufacture processes will be omitted, and a manufacture process of the piezoelectric sheet 10, a bonding process of the piezoelectric sheet 10 and the cavity plate 900, and a joining process of the FPC board 50 will be described below in detail.

In the manufacture process of the piezoelectric sheet 10, ceramic powder of lead zirconate titanate (PZT) having ferroelectricity and resin are first mixed, and two trapezoidal green sheets are formed, which become the first piezoelectric layer 21 and the second piezoelectric layers 23 and 24.

Then, with respect to one of the green sheets (hereinafter referred to as a first green sheet), the through holes 33 are formed in the corner areas, and conductive fillers are injected into the through holes 33. Thereafter, a mask is put on the first green sheet, in which holes having outer edges of the same shape as the foregoing individual electrodes are provided at positions corresponding to the individual electrodes 11, 12a and 12b, holes having outer edges of the same shape as the foregoing common electrodes 31 are provided at positions corresponding to the common electrodes 31, and holes having outer edges of the same shape as the common electrodes 32 are provided at positions corresponding to the common electrodes 32. Then, conductive paste is applied from above the mask, so that electrode patterns of the individual electrodes 11, 12a and 12b and the common electrodes 31 and 32 are formed on the first green sheet.

Besides, with respect to the other green sheet (hereinafter referred to as a second green sheet), a conductive paste is printed on the whole surface of the green sheet, so that the electrode pattern of the internal electrode 22 is formed.

Thereafter, the first and the second green sheets are overlapped with each other, and the laminate is fired, so that the piezoelectric sheet 10 is prepared. Incidentally, the formation of the electrode patterns corresponding to the individual electrodes 11, 12a and 12b and the common electrodes 31 and 32 may be performed after the electrode pattern of the internal electrode 22 is formed on the second green sheet, and after the first green sheet is laminated on the second green sheet.

Thereafter, the piezoelectric sheet 10 is put at a predetermined position on the surface of the cavity plate 900, and is bonded and fixed. Incidentally, at the same time as this process, the base plate 800, the aperture plate 700, the supply plate 600, the third manifold plate 500, the second manifold plate 400, the first manifold plate 300, the cover plate 200, and the nozzle plate 100 are jointed to the lower layer of the cavity plate 900.

On the other hand, the FPC board 50 is prepared by a well-known method. The nickel plating layer 55 and the solder layer 56 are formed in each of the pads 52 and 53 provided on the FPC board 50. Thereafter, the FPC board 50 is put on the piezoelectric sheet 10.

And then, the FPC board 50 is soldered to the piezoelectric sheet 10 by the thermo compression bonding. At that time, the pads 52 are connected to the contact land parts 17 of the individual electrodes 11 (except for the individual electrodes 12a and 12b), and the pads 53 are connected to the contact land parts 37 of the common electrodes 31 and 32. By this joining, the pads 52 and 53 of the board 50 are electrically connected to the contact land parts 17 and 37, and the ink-jet head 9 of this embodiment is completed.

In the above, the description has been given to the ink-jet printer 1, the ink-jet head 9 and the method of manufacturing the ink-jet head 9. In this ink-jet head 9, since the dummy individual electrodes 12a and 12b are provided at the outer periphery of the true individual electrodes 11, uneven deformation of the piezoelectric sheet 10 does not occur in the drive area 13a, and the ink can be uniformly discharged from the respective nozzles 111.

Besides, in this embodiment, the dummy ink pressure chambers 912 are provided at the positions corresponding to the dummy individual electrodes 12a and 12b, so that a difference in the surrounding structure does not occur at the boundary between the drive area 13a and the non-drive area 13b, and the discharge characteristics of ink become uniform among the respective nozzles.

In the case where the dummy ink pressure chambers 912 do not exist, since the joint area between the cavity plate 900 and the piezoelectric sheet 10 at the side of the non-drive area 13b becomes wide, uneven deformation of the piezoelectric sheet 10 occurs by the influence at the boundary between the drive area 13a and the non-drive area 13b. However, when the dummy ink pressure chambers 912 are provided as in this embodiment, since the joint mode of the cavity plate 900 and the piezoelectric sheet 10 becomes substantially the same at the non-drive area 13b side and the drive area 13a side, the ink can be uniformly discharged from the respective nozzles 11.

Besides, in this embodiment, the common electrodes 31 and 32 are provided on the surface of the piezoelectric sheet 10, so that the internal electrode 22 is led to the surface side of the piezoelectric sheet 10 via the through holes 33. At this time, since the internal electrode 22 and the common electrodes 31 and 32 are electrically connected via the plural through holes 33, even if one of the through holes 33 is broken by damage or the like, the electrical connection between the internal electrode 22 and the common electrodes 31 and 32 can be kept by the other through hole 33. Therefore, according to this embodiment, the ink-jet head 9 having high durability and reliability can be provided.

Besides, especially in this embodiment, the common electrodes 31 and 32 are provided at the positions outside the individual electrode formation area 13 on the surface of the piezoelectric sheet 10, so that uneven deformation of the piezoelectric sheet 10 does not occur in the drive area 13a near the common electrodes 31 and 32.

Since the common electrodes 31 and 32 become reversed poles of the individual electrodes 11, when the common electrodes 31 and 32 exist near the individual electrodes 11, a difference in deformation mode of the piezoelectric sheet 10 occurs between an area corresponding to the individual electrode 11 away from the common electrodes 31 and 32 and an area corresponding to the individual electrode 11 near the common electrodes 31 and 32. However, in this embodiment, since the common electrodes 31 and 32 are provided at the positions most separate from the individual electrodes 11 of the drive area 13a, it is possible to prevent uneven deformation from occurring in the piezoelectric sheet 10, and it is possible to prevent unevenness from occurring in the discharge characteristic of ink.

Incidentally, in this embodiment, since the FPC board 50 is fixed to the piezoelectric sheet 10 by joining the pads 52 and 53 and the contact land parts 17 and 37 with solder, when force in a peeling direction is applied to the FPC board 50, a load is applied to a joint portion between the pad 52, 53 and the individual electrode 11/the common electrode 31, 32, and in the worst case, there is a possibility that the portion is broken.

On the other hand, in this embodiment, the common electrode 32 is provided at the end on the surface of the piezoelectric sheet 10 at the rear end side of the FPC board 50, and the contact land parts 37 are disposed to form the triangular shape at the end, so that the joint between the FPC board 50 and the piezoelectric sheet 10 is strengthened.

In the common electrode 32, since the contact land parts 37 are disposed to form the triangular shape, even if force is applied in various directions, the joint of the common electrode 32 and the pads 53 is hard to break. Therefore, according to this embodiment, the ink-jet head 9 having high durability can be provided.

Besides, in this embodiment, in addition to the common electrode 32, the common electrode 31 is provided at the corner part of the upper bottom side of the piezoelectric sheet 10, and the piezoelectric sheet 10 is fixed to the FPC board 50. Thus, even if the force in the peeling direction is applied to the FPC board 50, the joint of the common electrodes 31 and 32 and the pads 53 can be kept well.

Besides, in this embodiment, since the contact land parts 17 and 37 are made to protrude from the periphery, at the time of compression bonding of the FPC board 50 and the piezoelectric sheet 10, it is possible to prevent the piezoelectric sheet 10 from being damaged. When the contact land parts 17 and 37 are formed to be flat with respect to the periphery, in the case where minute dust adheres to the surface of the piezoelectric sheet 10 at the time of thermo compression bonding, there is a possibility that press force is applied to areas of the piezoelectric sheet 10 opposite to the ink pressure chambers 911 and 912 of the cavity plate 900.

At this time, since the piezoelectric sheet 10 at upper parts of the ink pressure chambers 911 and 912 is not supported by the cavity plate 900, when the press force is applied, there is a high possibility that damage occurs. In this embodiment, since the contact land parts 17 and 37 are made convex so as to prevent such a state, the ink-jet head 9 having high reliability can be manufactured.

Incidentally, the contact land parts 17 and 37 are formed at part of the surface of the piezoelectric sheet opposite to the joint surface of the piezoelectric sheet 10 and the cavity plate 900 (that is, the positions outside the surfaces opposite to the ink pressure chambers 911 and 912), so that the piezoelectric sheet 10 is not damaged by the press of the contact land parts 17 and 37.

Besides, in this embodiment, since the projection parts 18 are provided on the piezoelectric sheet 10, when the piezoelectric sheet 10 is bonded to the cavity plate 900, the occurrence of uneven bonding at the joint surface of the cavity plate 900 and the piezoelectric sheet 10 is suppressed. When a press force is applied from an upper part of the piezoelectric sheet 10, the force is transmitted to the joint surface of the piezoelectric sheet 10 and the cavity plate 900 through the contact land parts 17 and 37, and when the projection parts 18 do not exist at this time, the press force applied to the joint surface becomes uneven between the periphery of each of the contact land parts 17 and 37 and the other area, and as a result, uneven bonding occurs. On the other hand, when the projection parts 18 are provided as in this embodiment, since the force is uniformly transmitted to the joint surface of the piezoelectric sheet 10 and the cavity plate 900 through the contact land parts 17 and 37 and the projection parts 18 at the time of the press, the back surface of the piezoelectric sheet 10 can be uniformly bonded to the cavity plate 900. When the uniform bonding as stated above is obtained, the discharge characteristic of ink becomes uniform among the respective nozzles 111, and the performance of the ink-jet head 9 is improved.

Besides, in this embodiment, the heights of the contact land parts 17 of the individual electrodes 11 and the contact land parts 37 of the common electrodes 31 and 32 (heights from the surface of the first layer 21 of the piezoelectric sheet 10) are made equal to one another, so that the pads 52 and 53 of the board 50 can be uniformly connected to the contact land parts 17 and 37. Therefore, according to this embodiment, it is possible to prevent a local load from being applied to the board 50 or the piezoelectric sheet 10 at the time of assembly, and it is possible to prevent the occurrence of the contact land parts 17 and 37 which cause poor contact.

Besides, especially in this embodiment, the respective contact land parts 17 and 37 are made to have the same size and the same shape, and the surface areas of the respective contact land parts 17 and 37 to be soldered are made substantially the same.

In the case where the contact land parts 17 and 37 and the pads 52 and 53 are connected by soldering, when the surface areas of the respective contact land parts 17 and 37 are different from each other, variations occur in the amount of solder adhered to the contact land parts 17 and 37. Then, in such a case, there occur the contact land parts 17 and 37 where the amount of solder is so large that all the solder does not melt and the joint becomes incomplete, and the contact land parts 17 and 37 where the amount of solder is so small that the solder is evaporated and the joint becomes incomplete.

On the other hand, in this embodiment, since the surface areas of the contact land parts 17 and 37 are made substantially the same, the amount of solder can be made uniform among the contact land parts 17 and 37, and it is possible to prevent the occurrence of the contact land parts 17 and 37 with incomplete joint. Therefore, according to this embodiment, the ink-jet head 9 having high reliability can be provided.

Incidentally, the ink-jet head, the ink-jet printer and the method of manufacturing the ink-jet head according to the invention are not limited to the above embodiment, and various modes can be adopted.

In the above embodiment, although the ink-jet head 9 has been exemplified which includes the piezoelectric sheet 10 in which the individual electrodes 11, 12a 12b are disposed two-dimensionally in a matrix form, the invention may be applied to, for example, an ink-jet head in which individual electrodes are disposed only in one direction.

Besides, in the above embodiments although the drive circuit 60 is provided in the FPC board 50, the drive circuit 60 may be provided separately from the FPC board 50. In this case, the FPC board 50 has only to be made a wiring board having a function as a connection line of electrically connecting the individual electrodes 11 and the common electrodes 31 and 32 to the drive circuit.

Besides, the arrangement of the plural individual electrodes 11, 12a and 12b is not limited to the matrix form, and any arrangement may be adopted as long as it has specified regularity.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents

What is claimed is:

1. An ink-jet head comprising:
   a piezoelectric sheet including:

an electrode formation area having a drive area and a non-drive area around the drive area on a surface of the piezoelectric sheet;

plural individual electrodes formed on the electrode formation area; and an internal electrode corresponding to the respective individual electrodes of the electrode formation area formed in an inside of the piezoelectric sheet; and a board electrically connected to the respective individual electrodes in the drive area of the piezoelectric sheet, put into an electrically non-connected state to the respective individual electrodes in the non-drive area of the piezoelectric sheet, and applying drive voltage to the respective individual electrodes formed in the drive area of the piezoelectric sheet.

2. The ink-jet head according to claim 1, wherein the piezoelectric sheet is prepared by forming the plural individual electrodes at equal intervals in the drive area and around the drive area on a surface of a sheet-like piezoelectric material including the internal electrode, and firing the piezoelectric material in which the individual electrodes are formed.

3. The ink-jet head according to claim 1, wherein the plural individual electrodes are disposed in a matrix form in the electrode formation area of the piezoelectric sheet.

4. The ink-jet head according to claim 1, wherein a connection part electrically connected to the internal electrode via through holes are formed on the surface of the piezoelectric sheet.

5. The ink-jet head according to claim 4, wherein the connection part is electrically connected to the internal electrode via at least two or more through holes.

6. The ink-jet head according to claim 4, wherein the connection part is at a position away from the electrode formation area which is formed on the surface of the piezoelectric sheet.

7. The ink-jet head according to claim 4, wherein the connection part is formed on the surface of the piezoelectric sheet and at an end part thereof on a side where the board is provided to extend, the board is joined to the respective individual electrodes of the drive area and the connection part to be electrically connected to the respective individual electrodes of the drive area and the connection part, and the board is fixed to the piezoelectric sheet.

8. The ink-jet head according to claim 4, wherein the piezoelectric sheet is formed in a square shape, the connection part is provided at a corner part on the surface of the piezoelectric sheet, and the board is joined to the respective individual electrodes of the drive area and the connection part and is electrically connected thereto, and is fixed to the piezoelectric sheet.

9. The ink-jet head according to claim 4, wherein a convex contact part joined to electrodes provided on the board is formed on the respective individual electrodes of the drive area and the connection part of the piezoelectric sheet.

10. The ink-jet head according to claim 9, wherein the two or more convex contact parts are formed on the connection part of the piezoelectric sheet.

11. The ink-jet head according to claim 9, wherein a height of the convex contact part formed on the respective individual electrodes of the drive area is substantially equal to a height of the convex contact part formed on the connection part of the piezoelectric sheet.

12. The ink-jet head according to claim 9, wherein the contact parts of the connection part of the piezoelectric sheet and the contact parts of the respective individual electrodes of the drive area are soldered to the electrodes provided on the board, and surface areas of the contact parts are substantially equal to one another.

13. The ink-jet head according to claim 9, wherein the ink-jet head further includes a cavity plate including pressure chambers opened to a side of the piezoelectric sheet at positions corresponding to the respective individual electrodes of the drive area is joined to a back surface of the piezoelectric sheet, and the contact parts of the respective individual electrodes of the drive area and the contact parts of the connection part of the piezoelectric sheet are disposed at part of the surface of the piezoelectric sheet opposite to a joint surface of the cavity plate joined to the back surface of the piezoelectric sheet.

14. The ink-jet head according to claim 1, wherein a cavity plate including pressure chambers at positions corresponding to the respective individual electrodes of the drive area and the non-drive area is joined to a back surface of the piezoelectric sheet.

15. The ink-jet head according to claim 1, further comprising:

a cavity plate including pressure chambers each disposed correspondingly to the respective one of the individual electrodes in the non-drive area and the drive area.

16. The ink-jet head according to claim 1, wherein the individual electrodes in the non-drive area and the individual electrodes in the drive area have substantially the same shape.

17. An ink-jet printer comprising:

an ink-jet head including:

a piezoelectric sheet including:

an electrode formation area having a drive area and a non-drive area around the drive area on a surface of the piezoelectric sheet;

plural individual electrodes formed on the electrode formation area; and an internal electrode corresponding to the respective individual electrodes of the electrode formation area formed in an inside of the piezoelectric sheet; and a board electrically connected to the respective individual electrodes in the drive area of the piezoelectric sheet, put into an electrically non-connected state to the respective individual electrodes in the non-drive area of the piezoelectric sheet, and applying drive voltage to the respective individual electrodes formed in the drive area of the piezoelectric sheet.

18. The ink-jet printer according to claim 17, wherein the ink-jet head further comprises a cavity plate including pressure chambers each disposed correspondingly to the respective one of the individual electrodes in the non-drive area and the drive area.

19. The ink-jet printer according to claim 17, wherein the individual electrodes in the non-drive area and the individual electrodes in the drive area have substantially the same shape.

* * * * *